United States Patent
Kim et al.

(10) Patent No.: US 9,711,553 B2
(45) Date of Patent: Jul. 18, 2017

(54) IMAGE SENSOR INCLUDING A PIXEL HAVING PHOTOELECTRIC CONVERSION ELEMENTS AND IMAGE PROCESSING DEVICE HAVING THE IMAGE SENSOR

(71) Applicants: Tae Chan Kim, Yongin-si (KR); Dong Ki Min, Seoul (KR); Kwang Hyun Lee, Seongnam-si (KR); Yo Hwan Noh, Yongin-si (KR); Se Hwan Yun, Hwaseong-si (KR); Dae Kwan Kim, Suwon-si (KR); Young Jin Kim, Seoul (KR); Wang Hyun Kim, Namyangju-si (KR); Hyuk Soon Choi, Hwaseong-si (KR)

(72) Inventors: Tae Chan Kim, Yongin-si (KR); Dong Ki Min, Seoul (KR); Kwang Hyun Lee, Seongnam-si (KR); Yo Hwan Noh, Yongin-si (KR); Se Hwan Yun, Hwaseong-si (KR); Dae Kwan Kim, Suwon-si (KR); Young Jin Kim, Seoul (KR); Wang Hyun Kim, Namyangju-si (KR); Hyuk Soon Choi, Hwaseong-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 0 days.

(21) Appl. No.: 14/696,859

(22) Filed: Apr. 27, 2015

(65) Prior Publication Data

US 2015/0312461 A1    Oct. 29, 2015

Related U.S. Application Data

(60) Provisional application No. 61/985,019, filed on Apr. 28, 2014.

(30) Foreign Application Priority Data

Dec. 11, 2014    (KR) .................... 10-2014-0178098

(51) Int. Cl.
*H01L 27/146*    (2006.01)
*H04N 5/374*    (2011.01)
(Continued)

(52) U.S. Cl.
CPC ........ *H01L 27/1463* (2013.01); *G02B 3/0056* (2013.01); *G02B 5/201* (2013.01);
(Continued)

(58) Field of Classification Search
CPC ................................................... H04N 5/347
(Continued)

(56) References Cited

U.S. PATENT DOCUMENTS 7,385,671 B2    6/2008    Gardner et al.
7,777,804 B2    8/2010    Shan et al.
(Continued)

FOREIGN PATENT DOCUMENTS

JP    2003179819 A    6/2003
KR    20080014301 A    2/2008

*Primary Examiner* — Roberto Velez
*Assistant Examiner* — Cynthia Segura
(74) *Attorney, Agent, or Firm* — Harness, Dickey & Pierce, PLC

(57) ABSTRACT

An image sensor according to an example embodiment concepts includes a pixel array including pixels, and each of the pixels includes photoelectric conversion elements. The photoelectric conversion elements independently operating to detect a phase difference. The image sensor further includes a control circuit configured to independently control exposure times of each of the photoelectric conversion elements included in each of the pixels.

17 Claims, 30 Drawing Sheets

(51) Int. Cl.
| | |
|---|---|
| *H04N 9/04* | (2006.01) |
| *G02B 5/20* | (2006.01) |
| *G02B 3/00* | (2006.01) |
| *H04N 5/353* | (2011.01) |
| *H04N 5/355* | (2011.01) |
| *H04N 5/378* | (2011.01) |
| *H04N 5/347* | (2011.01) |
| *H04N 5/3745* | (2011.01) |

(52) U.S. Cl.
CPC .... *H01L 27/1464* (2013.01); *H01L 27/14609* (2013.01); *H01L 27/14621* (2013.01); *H01L 27/14627* (2013.01); *H01L 27/14641* (2013.01); *H01L 27/14645* (2013.01); *H04N 5/347* (2013.01); *H04N 5/3535* (2013.01); *H04N 5/35554* (2013.01); *H04N 5/378* (2013.01); *H04N 5/3742* (2013.01); *H04N 5/37457* (2013.01); *H04N 9/045* (2013.01)

(58) Field of Classification Search
USPC .......................................................... 348/308
See application file for complete search history.

(56) References Cited

U.S. PATENT DOCUMENTS

| | | | |
|---|---|---|---|
| 7,825,966 | B2 | 11/2010 | Manabe et al. |
| 7,944,496 | B2 | 5/2011 | Sakamoto |
| 8,541,857 | B2 | 9/2013 | Ahn et al. |
| 8,605,177 | B2 | 12/2013 | Rossi et al. |
| 9,288,382 | B2* | 3/2016 | Fujii ...................... H04N 5/347 |
| 2008/0303930 | A1* | 12/2008 | Kuroda ............. H01L 27/14603 348/308 |
| 2009/0002528 | A1* | 1/2009 | Manabe ............... H04N 5/2355 348/248 |
| 2009/0290052 | A1 | 11/2009 | Liu et al. |
| 2011/0073923 | A1* | 3/2011 | Tatani ............... H01L 27/14603 257/291 |
| 2011/0180689 | A1* | 7/2011 | Roy .................. H01L 27/14603 250/208.1 |
| 2011/0279705 | A1* | 11/2011 | Kuang ................... H04N 5/343 348/229.1 |
| 2013/0087875 | A1 | 4/2013 | Kobayashi et al. |
| 2013/0162800 | A1 | 6/2013 | Kim et al. |
| 2013/0176401 | A1 | 7/2013 | Monari et al. |
| 2013/0248684 | A1* | 9/2013 | Yun ................... H01L 27/14609 250/208.1 |
| 2013/0307040 | A1 | 11/2013 | Ahn et al. |
| 2014/0022354 | A1* | 1/2014 | Okigawa ................ H04N 5/347 348/46 |
| 2014/0077323 | A1* | 3/2014 | Velichko ........... H01L 27/14627 257/432 |
| 2014/0218567 | A1* | 8/2014 | Han ..................... H04N 5/2353 348/239 |
| 2014/0246561 | A1* | 9/2014 | Chen ................. H01L 27/14812 250/208.1 |
| 2015/0312557 | A1* | 10/2015 | Kim .................... H04N 5/3535 348/46 |
| 2015/0350583 | A1* | 12/2015 | Mauritzson ............ H04N 5/378 250/208.1 |
| 2016/0037112 | A1* | 2/2016 | Shim ..................... H04N 5/378 348/301 |

* cited by examiner

IMAGE SENSOR INCLUDING A PIXEL HAVING PHOTOELECTRIC CONVERSION ELEMENTS AND IMAGE PROCESSING DEVICE HAVING THE IMAGE SENSOR

CROSS-REFERENCE TO RELATED APPLICATIONS

This application claims priority under 35 U.S.C. §119(e) to U.S. provisional patent application No. 61/985,019 filed on Apr. 28, 2014, and under 35 U.S.C. §119(a) to Korean Patent Application No. 10-2014-0178098 filed on Dec. 11, 2014, the entire contents of each of which are hereby incorporated by reference.

BACKGROUND

Embodiments of the present inventive concepts relate to an image sensor, and more particularly to an image sensor which is capable of performing color imaging and phase difference auto focus, and/or a data processing system having the image sensor.

PAF may mean a phase detection auto focus or a phase difference auto focus. In photography, a dynamic range is the range between the maximum and minimum measurable light intensities. A varying degree of light intensity depends on a device that is used as a capture device, which decides an overall performance in a dynamic range of an imaging sensor.

A wide dynamic range (WDR) is also referred to as a high dynamic range (HDR). A WDR technology physically increases a pixel performance or increases a dynamic range of an imaging sensor by applying multiple exposure times to each pixel in a digital manner.

The ideal WDR sensor is a sensor with a high full well capacity (FWC). The FWC is defined as the maximum number of electrons of an incident signal that can be accommodated without saturation during readout. As the FWC increase, the dynamic range of an image sensor is increased.

In a digital signal lens reflex (DSLR) camera, a camera sensor includes pixels which can directly detect a phase difference so as to reduce a space occupied by a phase difference auto-focus module. Accordingly, the DSLR camera may perform an auto-focus. Such a technology is applied to a mirrorless DSLR.

The phase difference detecting pixel of the related art shields a portion of a photodiode with metal or the like, and detects only light incident onto an unshielded portion of the photodiode. In the related art, a method of detecting a phase difference using a shielded portion and a unshielded portion, that is, two pixels, has a problem that an image quality of a color image is deteriorated by two pixels which irregularly operate.

SUMMARY

At least one an example embodiment of the present inventive concepts is directed to an image sensor, including a pixel array having pixels, in which each of the pixels includes photoelectric conversion elements which are independently controlled.

The image sensor may further include a control circuit which configured to independently control exposure times of each of the photoelectric conversion elements included in each of the pixels.

According to some example embodiments, when the pixels are disposed in rows, the exposure time control circuit is configured to independently control the exposure time of each of the photoelectric conversion elements included in each of the pixels using a row address for one of the rows. According to some example embodiments, when the pixels are disposed in rows, the exposure time control circuit is configured to independently control the exposure time of each of the photoelectric conversion elements included in each of the pixels based on binning condition data.

The pixels may include a first pixel which includes a first photoelectric conversion element and a second photoelectric conversion element, and a second pixel which includes a third photoelectric conversion element and a fourth photoelectric conversion element. The image sensor further includes a control circuit configured to output a first control signal for controlling a first exposure time of the first photoelectric conversion element through a first control line, output a second control signal for controlling a second exposure time of the second photoelectric conversion element through a second control line, outputs a third control signal for controlling a third exposure time of the third photoelectric element through a third control line, and outputs a fourth control signal for controlling a fourth exposure time of the fourth photoelectric conversion element through a fourth control line, and the exposure time control circuit is configured to independently control the first exposure time, the second exposure time, the third exposure time, and the fourth exposure time.

According to some example embodiments, when the first pixel and the second pixel are disposed in a same row or a same column, the first exposure time and the third exposure time may be equal to each other, the second exposure time and the fourth exposure time may be equal to each other, and the first exposure time may be longer than the second exposure time. According to example embodiments, when the first pixel and the second pixel are disposed in the same column, the first exposure time and the fourth exposure time may be equal to each other, the second exposure time and the third exposure time may be equal to each other, and the first exposure time may be longer than the second exposure time.

According to some example embodiments, the pixels include a first pixel including a first photoelectric conversion element and a second photoelectric conversion element, and a second pixel including a third photoelectric conversion element and a fourth photoelectric conversion element, and when the first pixel and the second pixel are disposed in a same row, the first photoelectric conversion element and the second photoelectric conversion element share a first floating diffusion region through corresponding transfer gates, and the third photoelectric conversion element and the fourth photoelectric conversion element share a second floating diffusion region which is different from the first floating diffusion region through corresponding transfer gates.

According to some example embodiments, the pixels include a first pixel including a first photoelectric conversion element and a second photoelectric conversion element, and a second pixel including a third photoelectric conversion element and a fourth photoelectric conversion element, and when the first pixel and the second pixel are disposed in a same column, the first pixel and the second pixel share one floating diffusion region.

A first deep trench isolation (DTI) structure is formed between two corresponding pixels among the pixels, and a second DTI structure is formed between two corresponding photoelectric conversion elements among the photoelectric conversion elements included in each of the pixels.

Each of the pixels may further include a color filter which is formed over the photoelectric conversion elements included in each pixel, and a microlens formed over the color filter.

An example embodiment of the present inventive concepts is directed to a data processing system, including an image sensor and a controller configured to control an operation of the image sensor. The image sensor includes a pixel array including pixels, and each of the pixels includes photoelectric conversion elements which are independently controlled to detect a phase difference.

The image sensor may further include a control circuit which configured to independently control exposure time of each of the photoelectric conversion elements included in each of the pixels.

The photoelectric conversion elements included in each of the pixels may include a first photoelectric conversion element and a second photoelectric conversion element, the first photoelectric conversion element is controlled to have a relatively long-exposure time, conversion element, and the second photoelectric conversion element is controlled to have a relatively short-exposure time. The first photoelectric conversion element included in a first pixel among the pixels and the first photoelectric conversion element included in a second pixel adjacent to the first pixel are disposed in a diagonal direction.

The image sensor may further include a control circuit for configured to independently control exposure times of each of the photoelectric conversion elements included in each of the pixels, the photoelectric conversion elements include a first photoelectric conversion element which and a second photoelectric conversion element which is, the exposure time control circuit is configured to control the first photoelectric conversion element to have a relatively long-exposure time, and to control the second photoelectric conversion element to have a relatively short-exposure time, and the first photoelectric conversion element included in each of the pixels is configured to output respective pixel signals in parallel according to a control of the exposure time control circuit.

The image processing system may further include an analog-digital converter configured to convert pixel signals output from the photoelectric conversion elements included in each of the pixels into digital signals, a pre-image signal processor configured to generate color information from the digital signals, and a phase difference processing circuit which generates phase difference data corresponding to the phase difference from the digital signals and to compress the generated phase difference data.

A first deep trench isolation (DTI) structure is formed between two corresponding pixels among the pixels, and a second DTI structure is formed between two corresponding photoelectric conversion elements among the photoelectric conversion elements included in each of the pixels.

BRIEF DESCRIPTION OF THE DRAWINGS

These and/or other aspects and advantages of the present inventive concepts will become apparent and more readily appreciated from the following description of the embodiments, taken in conjunction with the accompanying drawings of which.

DETAILED DESCRIPTION OF EXAMPLE EMBODIMENTS

Figure 1:
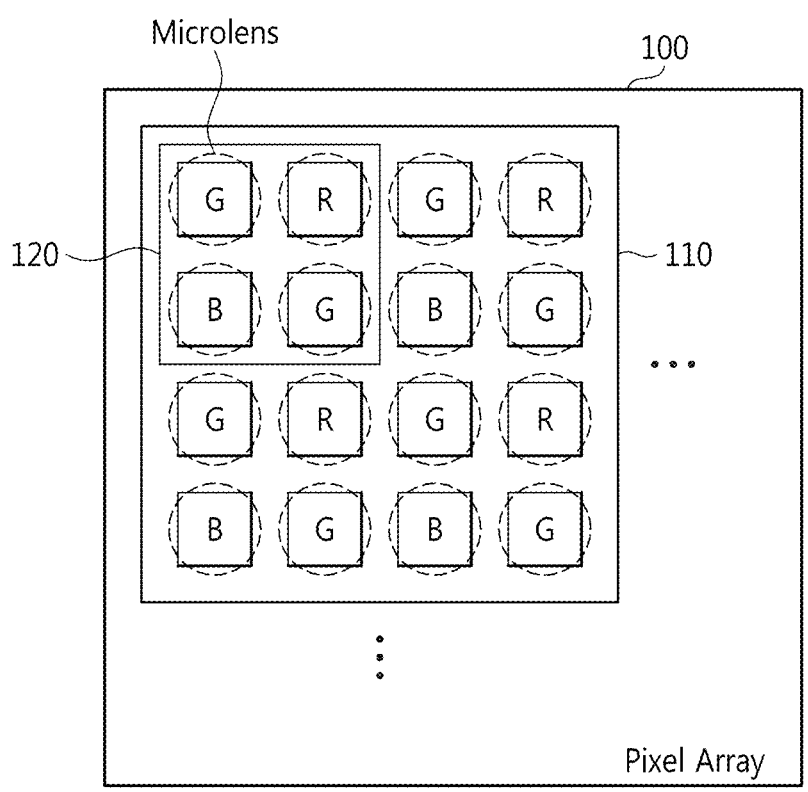
FIG. 1 shows a pixel array of an image sensor including a plurality of pixels according to an example embodiment of the present inventive concepts.

The present inventive concepts now will be described more fully hereinafter with reference to the accompanying drawings, in which embodiments of the invention are shown. The inventive concepts may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 shows a pixel array of an image sensor including a plurality of pixels according to an example embodiment of the present inventive concepts. Each of the plurality of pixels R, G, and B included in the pixel array 100 may include a plurality of photodiodes.

The pixel array 100 may be included in a portable electronic device. The portable electronic device may be used in a laptop computer, a cellular phone (or mobile phone), a smart phone, a tablet PC, a digital camera, a camcorder, a mobile internet device (MID), wearable computer, an internet of things (IoT) device, an internet of everything (IoE) device, and the like.

Each of the photodiodes included in the pixel array 100 may be any photo-electric conversion element and may be replaced with a phototransistor, a photogate, or a pinned-photodiode, as an example of a photo-electric conversion element.

Each of the multiple photodiodes included in each pixel may independently capture light or an image.

In FIG. 1, R represents a red pixel, G represents a green pixel, and B represents a blue pixel. A corresponding microlens may be formed over each of the pixels R, G, and B. The pixel array 100 may embody WDR or HDR without a loss of resolution. A structure of each of the pixels R, G, and B will be described with reference to FIGS. 7 and 8.

Figure 2:
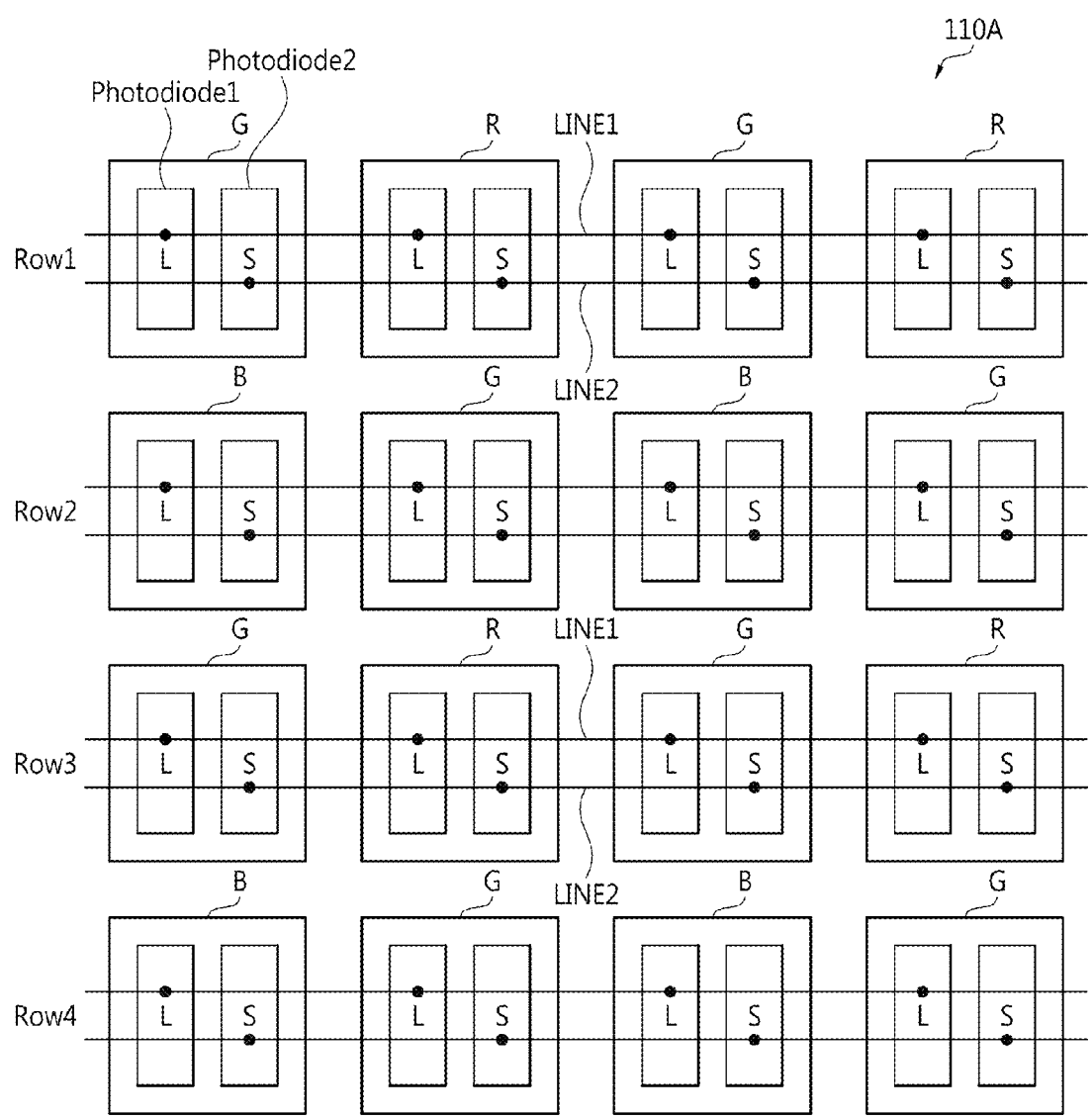
FIG. 2 shows a portion of the pixel array shown in FIG. 1.

FIG. 2 shows a portion 110A of the pixel array 100 shown in FIG. 1. Each of the pixels R, G, and B may include two photodiodes L and S which operate independently from each other.

In FIG. 2, L represents a first photodiode, and S represents a second photodiode. For example, L may be a photodiode which can generate a long-exposure image signal, and S may be a photodiode which can generate a short-exposure image signal.

Each of the pixels G and R disposed in respective rows Row1 and Row3 includes two photodiodes L and S.

Each of the pixels B and G disposed in respective rows Row2 and Row4 includes two photodiodes L and S.

Exposure time or integration time of each of the photodiodes L and S included in each of the pixels R, G, and B may be controlled to be different from each other in an independent manner by a row driver.

For convenience of description in FIG. 2, it is shown that each of the pixels R, G, and B includes two photodiodes L and S which are left and right embodied; however, instead each of the pixels R, G, and B may include two photodiodes L and S which are up-and-down embodied according to an example embodiment. For example, a gate of a transfer transistor which is connected to each photodiode L of each of the pixels R, G, and B disposed in each of the rows Row1 to Row4 is connected to a first corresponding transfer line (or a first metal line; LINE1), and a gate of a transfer transistor connected to each photodiode S of each of the pixels R, G, and B disposed in each of the rows Row1 to Row4 is connected to a second corresponding transfer transistor (or a second metal line; LINE2).

Figure 3:
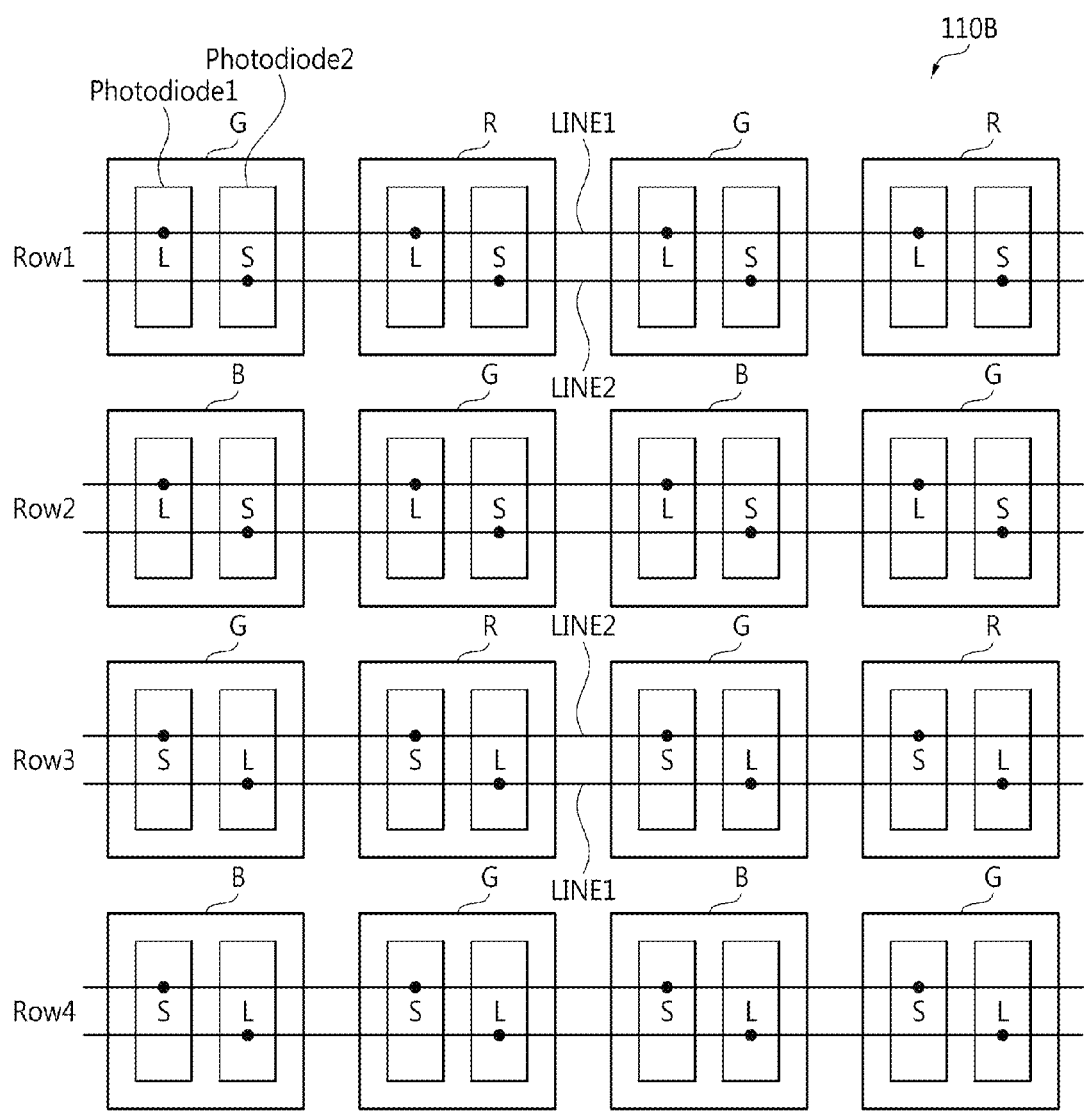
FIG. 3 shows a portion of the pixel array shown in FIG. 1.

FIG. 3 shows a portion 110B of the pixel array 100 shown in FIG. 1. Each of the pixels R, G, and B includes two photodiodes L and S which operate independently from each other.

Positions of two photodiodes L and S included in rows Row3 and Row4 of FIG. 3 are opposite to positions of two photodiodes L and S included in rows Row3 and Row4 of FIG. 2 each other.

As exemplarily shown in FIGS. 2 and 3, positions of photodiodes L and S included in each of the pixels R, G, and B may be variously changed according to a design specification.

For example, the gate of a transfer transistor, which is connected to each photodiode L of each of the pixels R, G, and B disposed in each of the rows Row1 to Row4, is connected to the first corresponding transfer line (or the first metal line; LINE1); and the gate of a transfer transistor, which is connected to each photodiode S of each of the pixels R, G, and B, is connected to the second corresponding transfer transistor (or the second metal line; LINE2).

Figure 4:
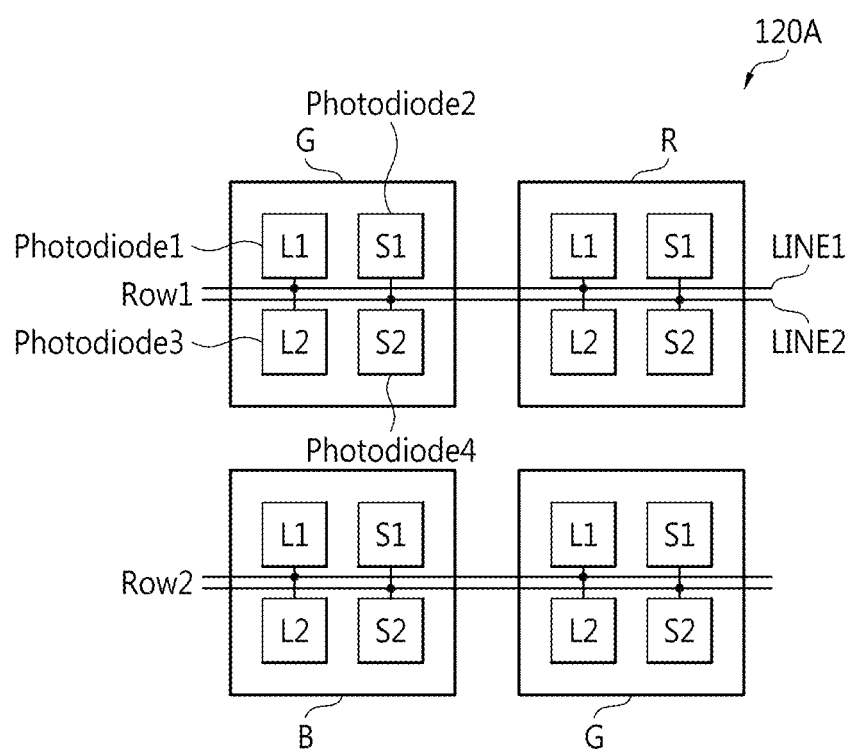
FIG. 4 shows a portion of the pixel array shown in FIG. 1.

FIG. 4 shows a portion 120A of the pixel array 100 shown in FIG. 1. Each of the pixels R, G, and B includes four photodiodes L1, L2, S1, and S2 which operate independently from each other.

According to an example embodiment, exposure time or integration time of each of the photodiodes L1, L2, S1, and S2 included in each of the pixels R, G, and B may be controlled to be different from each other in an independent manner by a row driver.

According to another example embodiment, exposure time or integration time of each of the photodiodes L1 and L2 included in each of the pixels R, G, and B may be controlled to be the same as each other by a row driver, and exposure time or integration time of each of photodiodes S1 and S2 included in each of the pixels R, G, and B may be controlled to be the same as each other by the row driver.

The exposure time or the integration time of each of the photodiodes L1 and L2 may be set to be longer than the exposure time or the integration time of each of the photodiodes S1 and S2.

Physical characteristics of each of the photodiodes L1 and L2 may be the same as or different from each other. Moreover, physical characteristics of each of the photodiodes S1 and S2 may be the same as or different from each other.

L1 means a first photodiode, S1 means a second photodiode, L2 means a third photodiode, and S2 means a fourth photodiode.

For example, each of L1 and L2 may be a photodiode which can generate a long-exposure image signal, and each of S1 and S2 may be a photodiode which can generate a short-exposure image signal.

Each of the pixels G and R disposed in a row Row1 includes four photodiodes L1, L2, S1, and S2.

Each of the pixels B and G disposed in a row Row2 includes four photodiodes L1, L2, S1, and S2.

Each of the pixels R, G, and B includes two photodiodes L1 and L2 which can generate long-exposure image signals, and includes two photodiodes S1 and S2 which can generate short-exposure image signals. Accordingly to one or more embodiments, a position of each of the photodiodes L1, L2, S1, and S2 may be variously changed according to a design specification.

For example, a gate of each transfer transistor connected to each of the photodiodes L1 and L2 of each of the pixels R, G, and B disposed in each of the rows Row1 and Row2 is connected to the first corresponding transfer line (or the first metal line; LINE1), and a gate of each transfer transistor connected to each of the photodiodes S1 and S2 of each of the pixels R, G, and B is connected to the second corresponding transfer line (or the second metal line; LINE2) as shown in FIG. 4.

Figure 5:
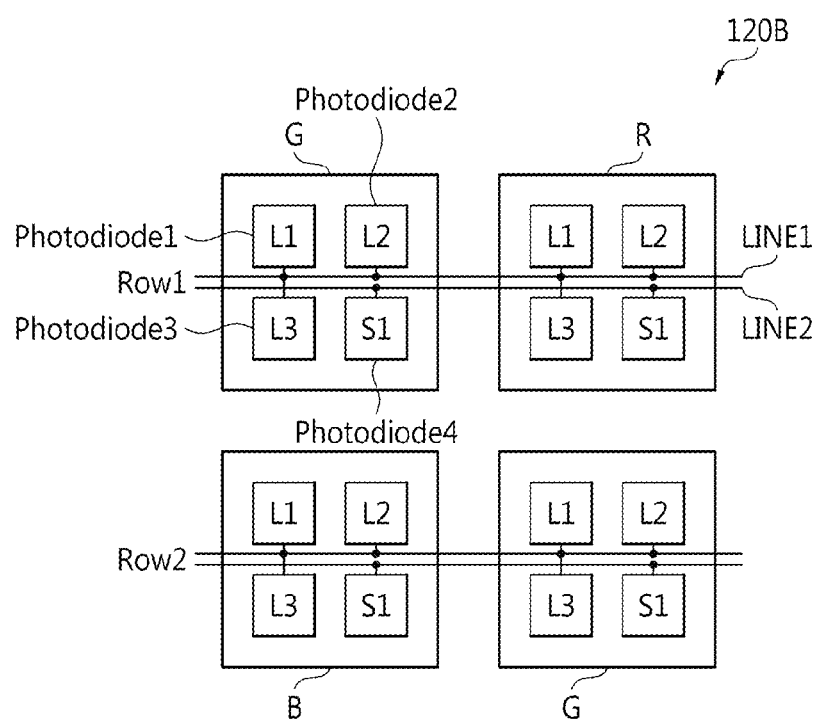
FIG. 5 shows a portion of the pixel array shown in FIG. 1.

FIG. 5 shows a portion 120B of the pixel array 100 shown in FIG. 1. Each of the pixels R, G, and B includes four photodiodes L1, L2, L3, and S1 which operate independently from each other.

That is, each of the pixels R, G, and B includes three photodiodes L1, L2, and L3 which can generate long-exposure image signals, and includes one photodiode S1 which can generate short-exposure image signals. Accordingly to one or more embodiments, a position of each of the photodiodes L1, L2, L3, and S1 may be variously changed according to the design specification.

According to an example embodiment, exposure time or integration time of each of the photodiodes L1, L2, L3, and S1 included in each of the pixels R, G, and B may be controlled to be different from each other in an independent manner by the row driver.

According to another example embodiment, exposure time or integration time of each of the photodiodes L1, L2, and L3 included in each of the pixels R, G, and B may be controlled to be the same as each other by the row driver. The exposure time or integration time of each of the photodiodes L1, L2, and L3 may be set to be longer than the exposure time or integration time of the photodiode S1.

Physical characteristics of each of the photodiodes L1, L2, and L3 may be embodied to be the same as or different from each other.

L1 represents a first photodiode, L2 represents a second photodiode, L3 represents a third photodiode, and S1 represents a fourth photodiode.

For example, each of the photo diodes L1, L2, and L3 may be a photodiode which can generate long-exposure image signal, and the photo diode S1 may be a photodiode which can generate short-exposure image signal.

Each of the pixels G and R disposed in a row Row1 includes four photodiodes L1, L2, L3, and S1.

Each of the pixels B and G disposed in a row Row2 includes four photodiodes L1, L2, L3, and S1.

For example, a gate of each transfer transistor connected to each of the photodiodes L1, L2, and L3 of each of the pixels R, G, and B disposed in each of the rows Row1 and Row2 is connected to the first corresponding transfer line (or the first metal line; LINE1), and a gate of each transfer transistor connected to the photodiodes S1 of each of the pixels R, G, and B is connected to the second corresponding transfer line (or the second metal line; LINE2) as shown in FIG. 5.

Figure 6:
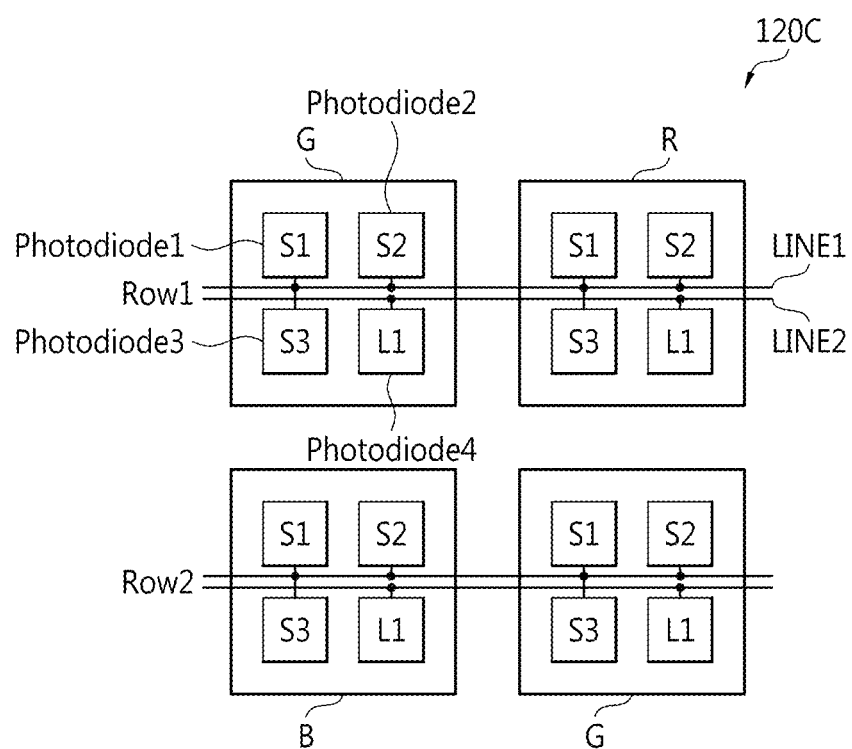
FIG. 6 shows a portion of the pixel array shown in FIG. 1.

FIG. 6 shows a portion 120C of the pixel array 100 shown in FIG. 1. Each of the pixels R, G, and B includes four photodiodes S1, S2, S3, and L1 which operate independently from each other.

That is, each of the pixels R, G, and B includes one photodiode L1 which can generate long-exposure image signals, and includes three photodiodes S1, S2, and S3 which can generate short-exposure image signals, respectively. According to one or more embodiments, a position of each of the photodiodes S1, S2, S3, and L1 may be variously changed according to the design specification.

According to an example embodiment, exposure time or integration time of each of the photodiodes S1, S2, S3, and L1 included in each of the pixels R, G, and B may be controlled to be different from each other in an independent manner by the row driver.

According to another example embodiment, exposure time or integration time of each of the photodiodes S1, S2, and S3 included in each of the pixels R, G, and B may be controlled to be the same as each other by the row driver.

Physical characteristics of each of the photodiodes S1, S2, and S3 may be embodied to be the same as or different from each other.

S1 means a first photodiode, S2 means a second photodiode, S3 means a third photodiode, and L1 means a fourth photodiode.

For example, the photo diode L1 may be a photodiode which can generate long-exposure image signal, each of photo diodes S1, S2, and S3 may be a photodiode which can generate short-exposure image signal.

Each of the pixels G and R disposed in a row Row1 includes four photodiodes S1, S2, S3, and L1.

Each of the pixels B and G disposed in a row Row2 includes four photodiodes S1, S2, S3, and L1.

For example, a gate of each transfer transistor connected to each of the photodiodes S1, S2, and S3 of each of the pixels R, G, and B disposed in each of the rows Row1 and Row2 is connected to the first corresponding transfer line (or the first metal line; LINE1), and a gate of a transfer transistor connected to the photodiode L1 of each of the pixels R, G, and B is connected to the second corresponding transfer line (or the second metal line; LINE2) as shown in FIG. 6.

Figure 7:
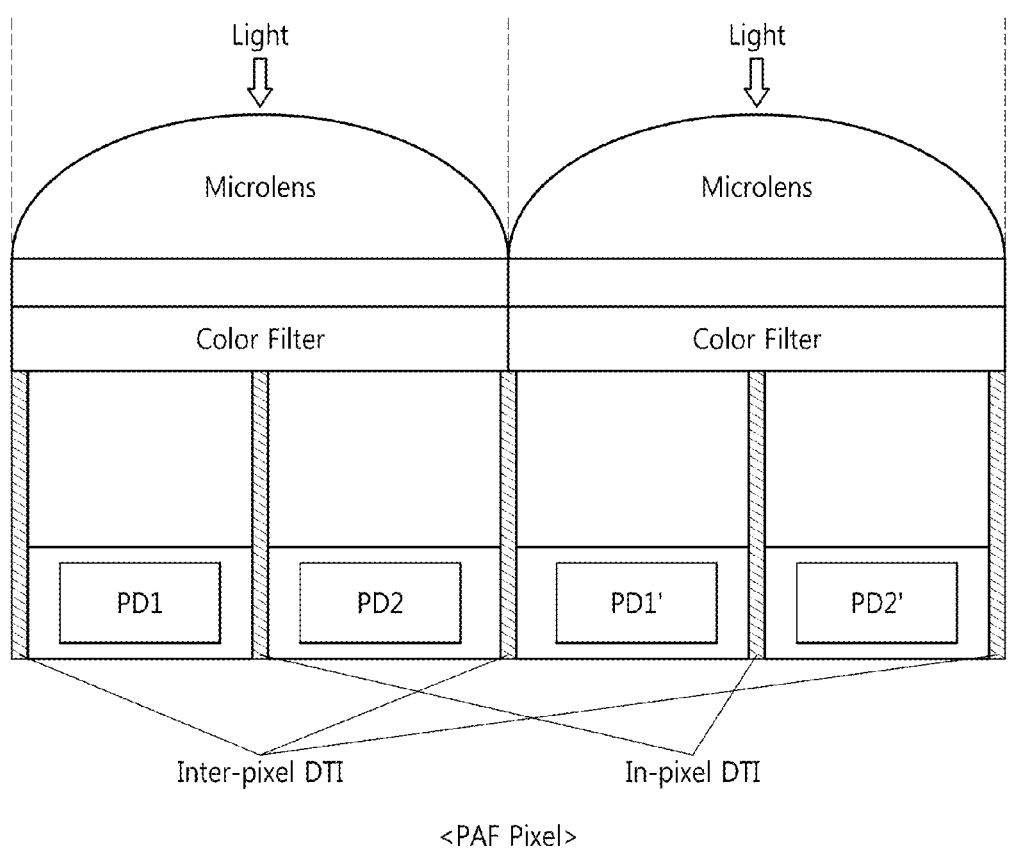
FIG. 7 shows a cross-sectional view of a pixel which includes two photodiodes.

FIG. 7 shows a cross-sectional view of a pixel which includes two photodiodes PD1 and PD2. The pixel may be R, G, or B of FIG. 1.

A photodiode PD1 or PD1' may be one of a photodiode which can generate a long-exposure image signal and a photodiode which can generate a short-exposure image signal, and a photodiode PD2 or PD2' may be the other of the photodiode which can generate the long-exposure image signal and the photodiode which can generate the short-exposure image signal.

Two photodiodes PD1 and PD2, and PD1' and PD2' may be formed in a silicon substrate, and deep trench isolation (DTI) may be formed between two photodiodes PD1 and PD2, and PD1' and PD2'. For example, in-pixel DTI may be formed between the two photodiodes PD1 and PD2, and PD1' and PD2' and inter-pixel DTI may be formed between pixels.

A metal wiring, a multi-layer wiring, or wiring layers may be formed in a circuit region formed between the two photodiodes PD1 and PD2, and PD1' and PD2' and a color filter. A lens buffer or a planarization layer may be formed between a microlens and the color filter.

Figure 8:
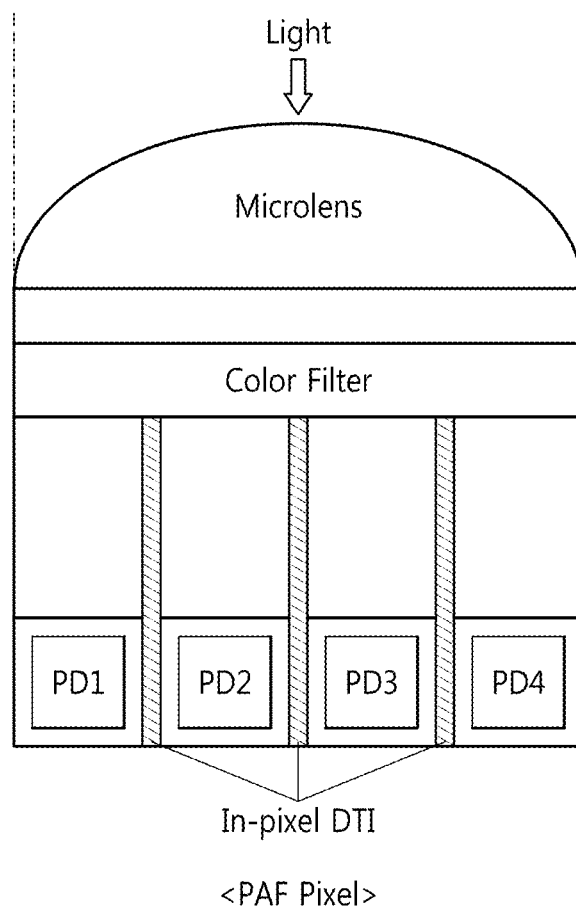
FIG. 8 shows a cross-sectional view of a pixel including four photodiodes.

FIG. 8 shows a cross-sectional view of a pixel including four photodiodes PD1 to PD4. The pixel may be R, G, or B of FIG. 1.

Referring to FIGS. 4 and 8, PD1 is one of L1, S1, L2, and S2, PD2 is another of L1, S1, L2, and S2, PD3 is still another of L1, S1, L2, and S2, and PD4 is the other of L1, S1, L2, and S2.

Referring to FIGS. 5 and 8, PD1 is one of L1, L2, L3, and S1, PD2 is another of L1, L2, L3, and S1, PD3 is still another of L1, L2, L3, and S1, and PD4 is the other of L1, L2, L3, and S1.

Referring to FIGS. 6 and 8, PD1 is one of S1, S2, S3, and L1, PD2 is another of S1, S2, S3, and L1, PD3 is still another of S1, S2, S3, and L1, and PD4 is the other of S1, S2, S3, and L1.

Four photodiodes PD1 to PD4 are formed in a silicon substrate, and a corresponding DTI, e.g., an in-pixel DTI, may be formed between two photodiodes PD1 and PD2, PD2 and PD3, and PD3 and PD4. An inter-pixel DTI may be formed between pixels.

A metal wiring, a multi-layer wiring, or wiring layers may be formed in a circuit region formed between the four photodiodes PD1 to PD4 and a color filter. A lens buffer or a planarization layer may be formed between a microlens and a color filter.

Figure 9:
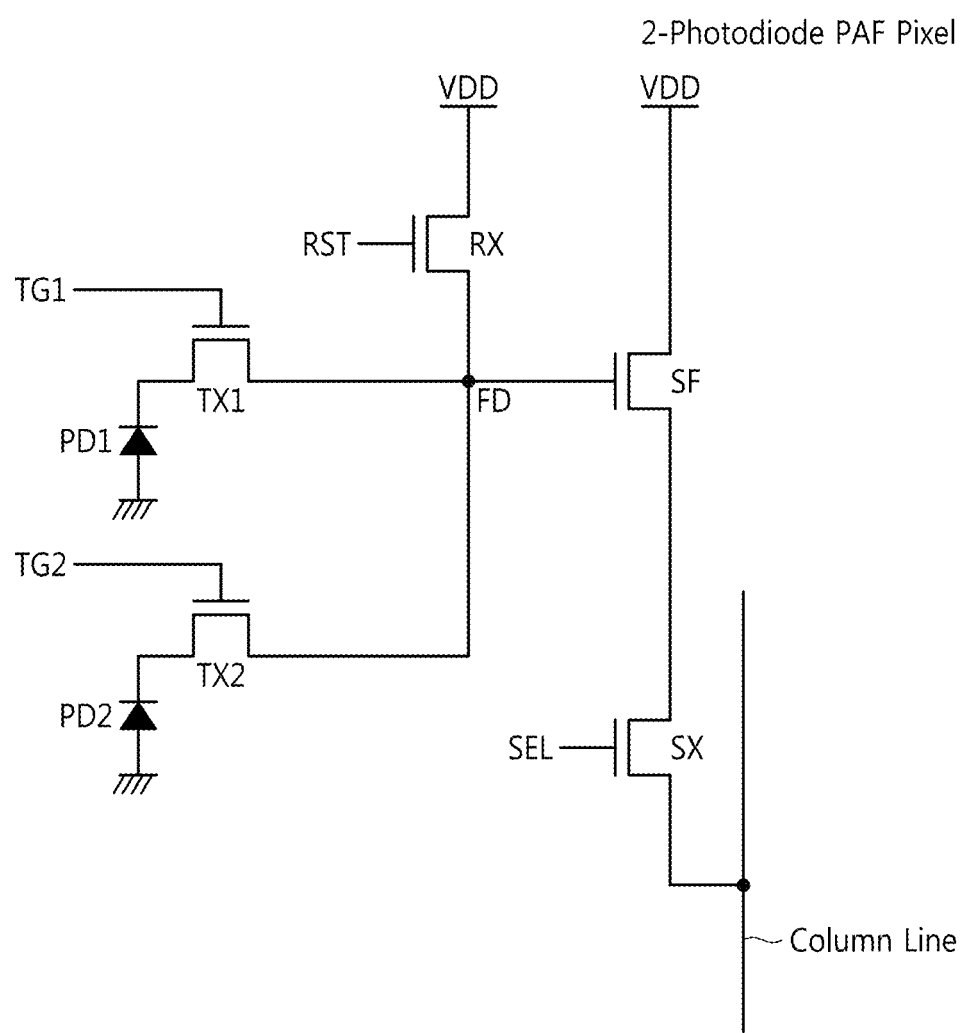
FIG. 9 shows a circuit diagram of a pixel, e.g., a PAF pixel, including two photodiodes.

FIG. 9 shows a circuit diagram of a pixel, e.g., a PAF pixel, including two photodiodes PD1 and PD2. Referring to FIGS. 2, 3, 7, and 9, a pixel includes two photodiodes PD1 and PD2, two transfer transistors TX1 and TX2, a reset transistor RX, a source follower SF, and a selection transistor SX.

Each of control signals TG1, TG2, RST, and SEL, which can control each of transistors TX1, TX2, RX, and SX, may be output from the row driver. An output signal of a selection transistor SX is supplied to a column line.

For convenience of description in FIG. 9, a pixel which has a shared floating diffusion region (FD) is shown; however, pixels which distinguish a long exposure and a short exposure according to an intention of a designer may not have photodiodes PD1 and PD2 that share one floating diffusion region (FD).

Figure 10:
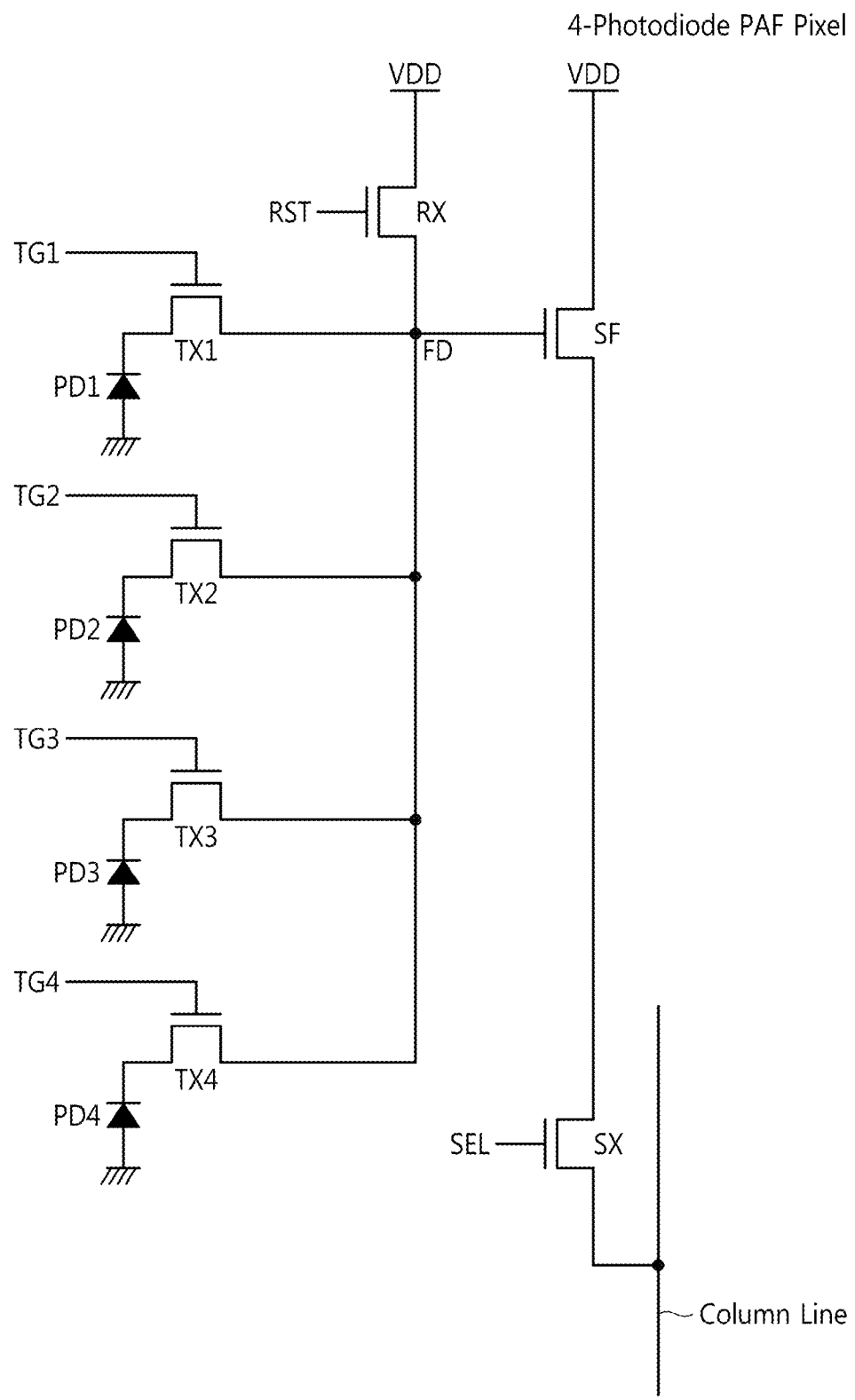
FIG. 10 is a circuit diagram of a pixel, e.g., a PAF pixel, including four photodiodes.

FIG. 10 is a circuit diagram of a pixel, e.g., a PAF pixel, including four photodiodes PD1 to PD4. Referring to FIGS. 4, 5, 6, 8, and 10, the pixel includes four photodiodes PD1 to PD4, four transfer transistors TX1 to TX4, a reset transistor RX, a source follower SF, and a selection transistor SX.

Each of the control signal TG1 to TG4, RST, and SEL which can control each of the transistors TX1 to TX2, RX, and SX may be output from the row driver. An output signal of the selection transistor SX is supplied to a column line.

For convenience of description in FIG. 10, a pixel which has a shared floating diffusion region (FD) is shown; however, pixels which distinguish a long exposure and a short exposure according to an intention of a designer may not share one floating diffusion region (FD) by each of the photodiodes PD1 to PD4.

Figure 11:
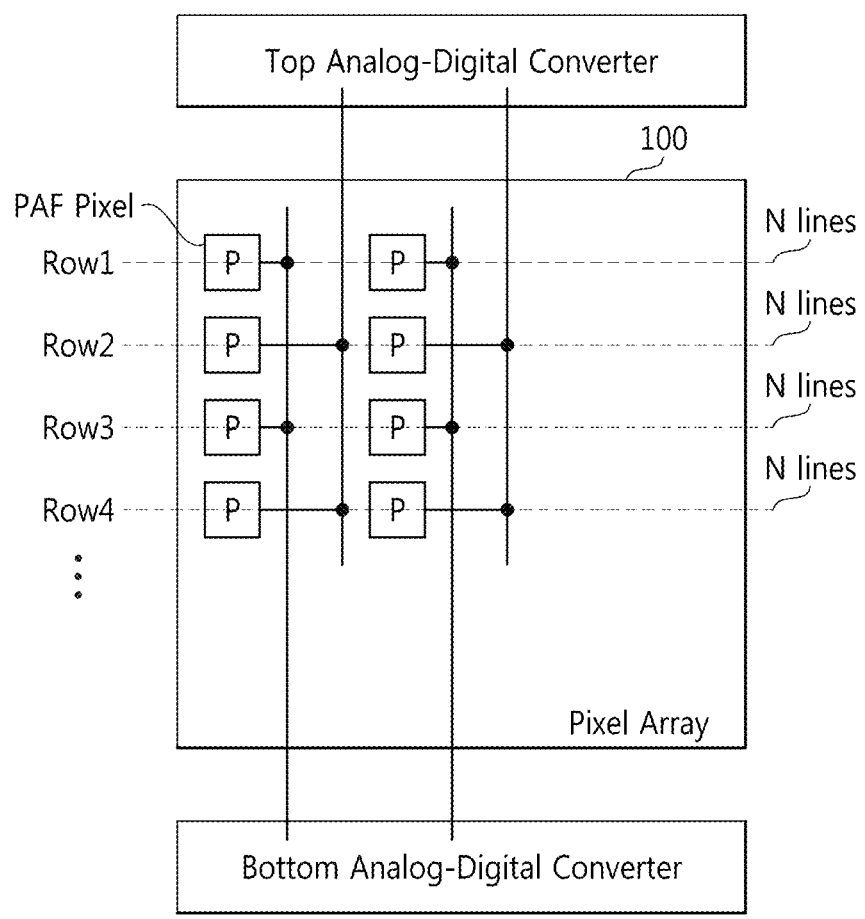
FIG. 11 is a block diagram of an image sensor including the pixel array of FIG. 1.

FIG. 11 is a block diagram of an image sensor including the pixel array of FIG. 1.

A structure of each PAF pixel P included in the pixel array is substantially the same as a structure of a pixel described referring to FIGS. 2 to 8. The PAF pixel P represents R, G, or B.

An output signal of each PAF pixel P arranged in odd numbered rows Row1, Row3, . . . , is transferred to a bottom analog-digital converter. Digital signals output from the bottom analog-digital converter may be stored in a corresponding memory or buffer.

An output signal of each PAF pixel P arranged in even numbered rows Row2, Row4, . . . , is transferred to a top analog-digital converter. Digital signals output from the top analog-digital converter may be stored in a corresponding memory or buffer.

As shown in FIG. 11, when each pixel P includes a plurality of photodiodes, N transfer lines which can transfer N control signals controlling exposure time or integration time of the plurality of photodiodes included in each pixel P may be embodied. Where N is a natural number equal to greater than 2.

Figure 12:
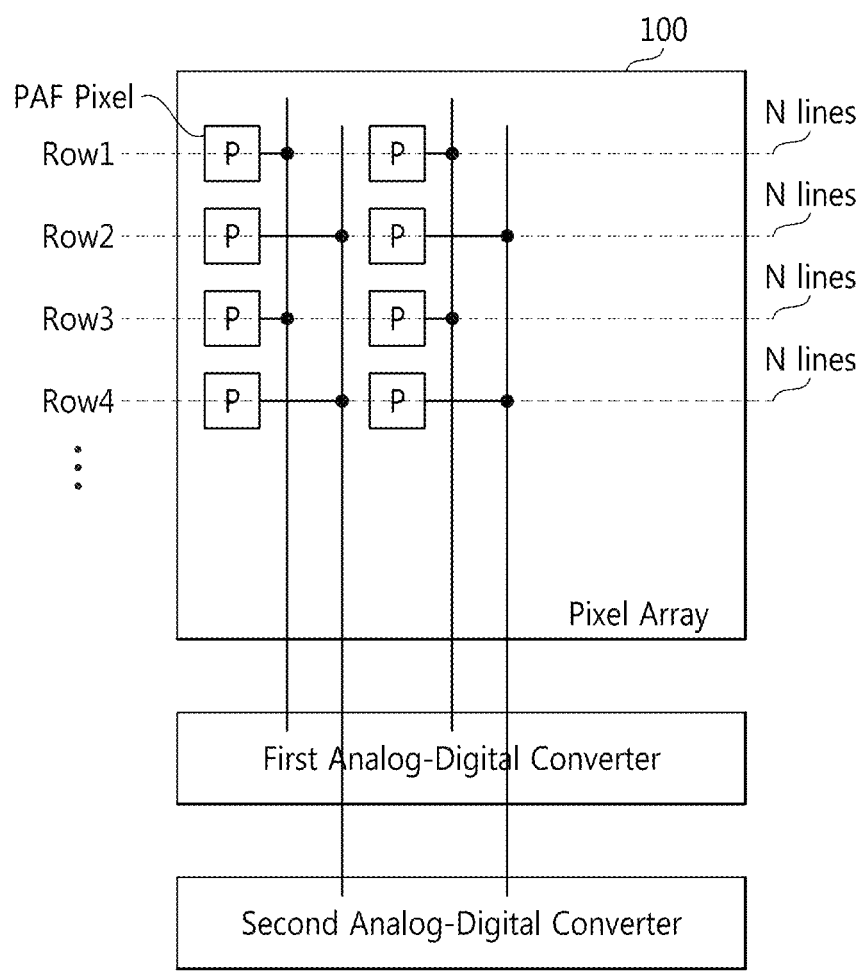
FIG. 12 is another block diagram of the image sensor including the pixel array of FIG. 1.

FIG. 12 is another block diagram of the image sensor including the pixel array of FIG. 1. A structure of each PAF pixel P included in the pixel array is substantially the same as a structure of the pixel described referring to FIGS. 2 to 8. The PAF pixel P represents R, G, or B.

An output signal of each PAF pixel P arranged in the odd numbered rows Row1, Row3, . . . , is transferred to a first analog-digital converter. Digital signals output from the first analog-digital converter may be stored in a corresponding memory or buffer. The memory or buffer may output image data.

An output signal of each PAF pixel P arranged in the even numbered rows Row2, Row4, . . . , is transferred to a second analog-digital converter. Digital signals output from the second analog-digital converter may be stored in a corresponding memory or buffer. The memory or buffer may output image data.

As shown in FIG. 12, when each pixel P includes a plurality of photodiodes, N transfer lines which can transfer N control signals controlling exposure time or integration time of the plurality of photodiodes included in each pixel P may be embodied.

Figure 13:
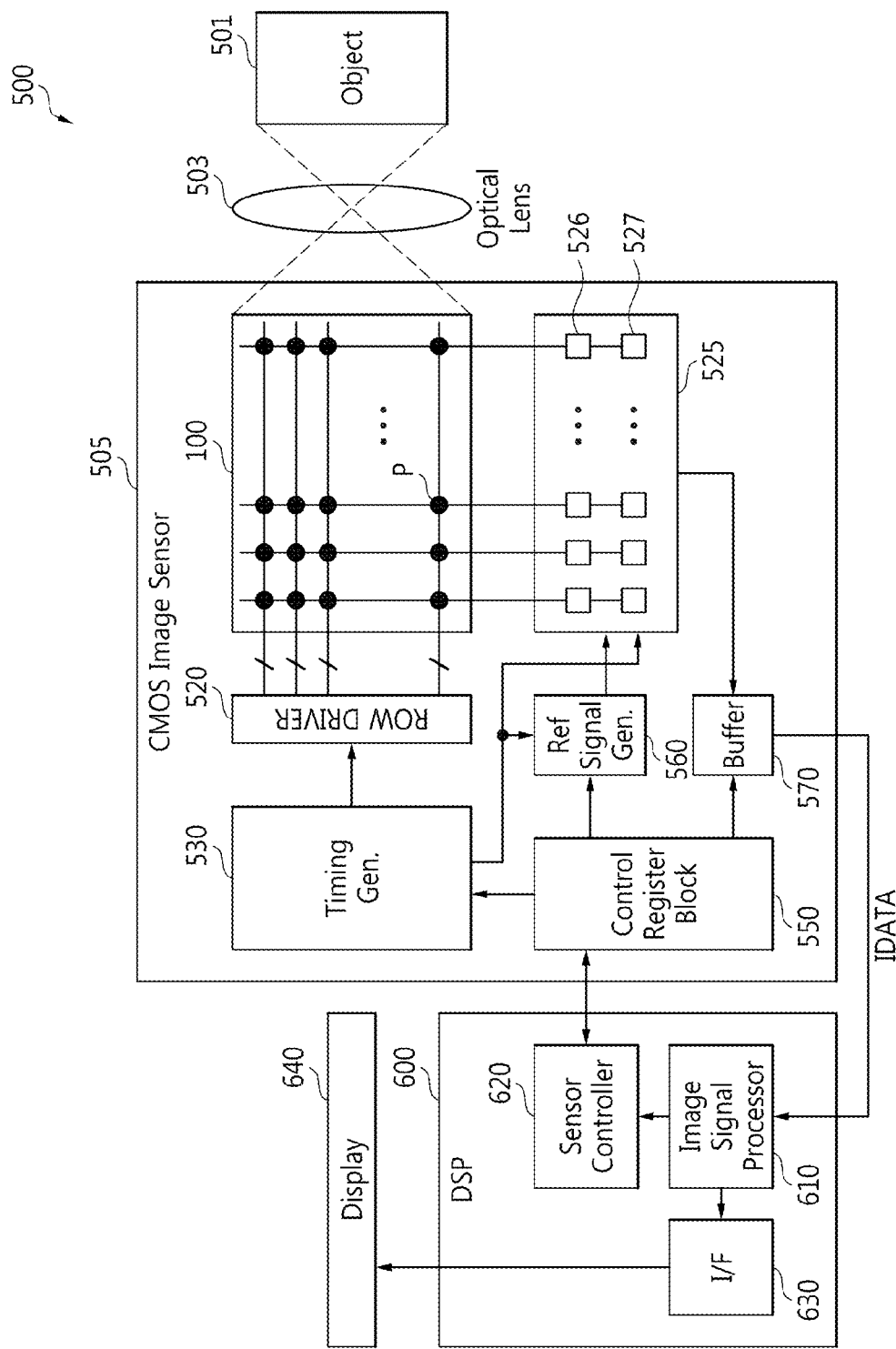
FIG. 13 is a block diagram according to an example embodiment of a data processing system including the pixel array shown in FIG. 1.

FIG. 13 is a block diagram according to an example embodiment of a data processing system 500 including the pixel array 100 shown in FIG. 1.

Referring to FIGS. 1 to 10, and 16, the data processing system 500 may be embodied as a portable electronic device described above. The data processing system 500 includes an optical lens 503, a CMOS image sensor 505, a digital signal processor (DSP) 600, and a display 640.

The CMOS image sensor 505 may generate image data IDATA of an object 501 incident through the optical lens 503. The image data IDATA are data corresponding to pixel signals output from the plurality of photodiodes P.

The CMOS image sensor 505 includes the pixel array 100, a row driver 520, a readout circuit 525, a timing generator 530, a control register block 550, a reference signal generator 560, and a buffer 570.

The pixel array 100 includes a plurality of pixels P. The pixel P of the CMOS image sensor 505 may be manufactured using a CMOS manufacture process. As described referring to FIGS. 1 to 10, each of the plurality of pixels P may include one or more photodiodes.

The pixel array 100 includes pixels P arranged in a matrix shape. The pixels P transfer pixel signals to column lines.

The row driver 520 drives control signals to the pixel array 100 for controlling an operation of each of the pixels P according to a control of the timing generator 530.

The row driver 520 may function as a control signal generator which can generates control signals. For example, the control signals may include the control signals RST, TG1, TG2, and SEL shown in FIG. 9, or may include the control signals RS, TG1 to TG4, and SEL shown in FIG. 10.

The timing generator 530 controls an operation of the row driver 520, the readout circuit 525, and the reference signal generator 560 according to a control of the control register block 550.

The readout circuit 525 includes the analog-digital converter 526 on a column basis and a memory 527 on a column basis. According to an example embodiment, the analog-digital converter 526 may perform a function of correlated double sampling (CDS).

The read out circuit 525 outputs a digital image signal corresponding to a pixel signal output from each pixel P.

The control register block 550 controls an operation of the timing generator 530, the reference signal generator 560, and the buffer 570 according to a control of the DSP 600.

The buffer 570 transfers image data IDATA corresponding to a plurality of digital image signals output from the readout circuit 525 to the DSP 600.

The image data IDATA include first image data corresponding to long-exposure image signals and second image data corresponding to short-exposure image signals.

The DSP 600 includes an image signal processor (ISP) 610, a sensor controller 620, and an interface 630.

The ISP 610 controls the sensor controller 620 which controls the control register block 550, and the interface 630.

According to an example embodiment, the CMOS image sensor 505 and the DSP 600 may be embodied in one package, e.g., a multi-chip package (MCP).

The CMOS image sensor 505 and the ISP 610 are separated from each other in FIG. 13; however, the ISP 610 may be embodied as a portion of the CMOS image sensor 505.

The ISP 610 processes the image data IDATA transferred from the buffer 570, and transfers processed image data to the interface 630. For example, the ISP 610 may interpolate image data IDATA corresponding to pixel signals output from the pixels P, and generate interpolated image data.

The sensor controller 620 may generate various control signals for controlling the control register block 550 according to a control of the ISP 610.

The interface 630 may transfer the image data processed by the ISP 610, e.g., the interpolated image data, to the display 640.

The display 640 may display the interpolated image data output from the interface 630. The display 640 may be embodied in a thin film transistor-liquid crystal display (TFT-LCD), a light emitting diode (LED) display, an organic LED (OLED) display, an active-matrix OLED (AMOLED) display, or a flexible display.

Figure 14:
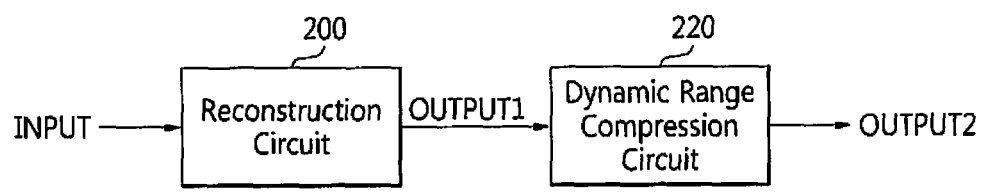
FIG. 14 is a schematic block diagram of an image signal processor of FIG. 13.
Figure 15A:
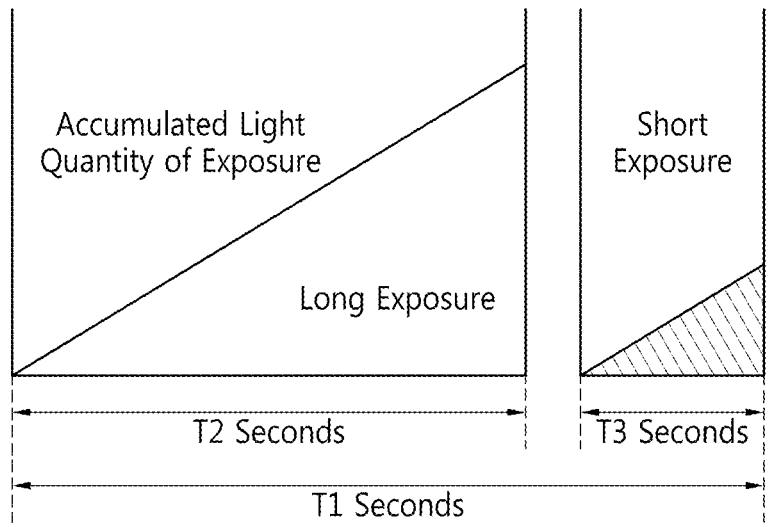
FIGS. 15A and 15B show exposure times and an amount of accumulated exposure light during one field in a CMOS image sensor shown in FIG. 13.
Figure 15B:
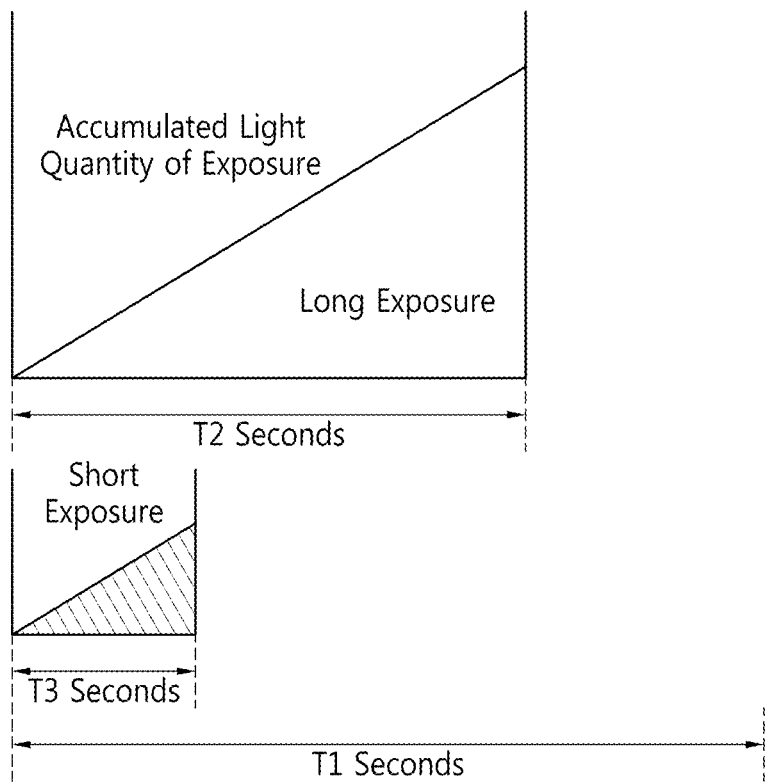
Figure 16:
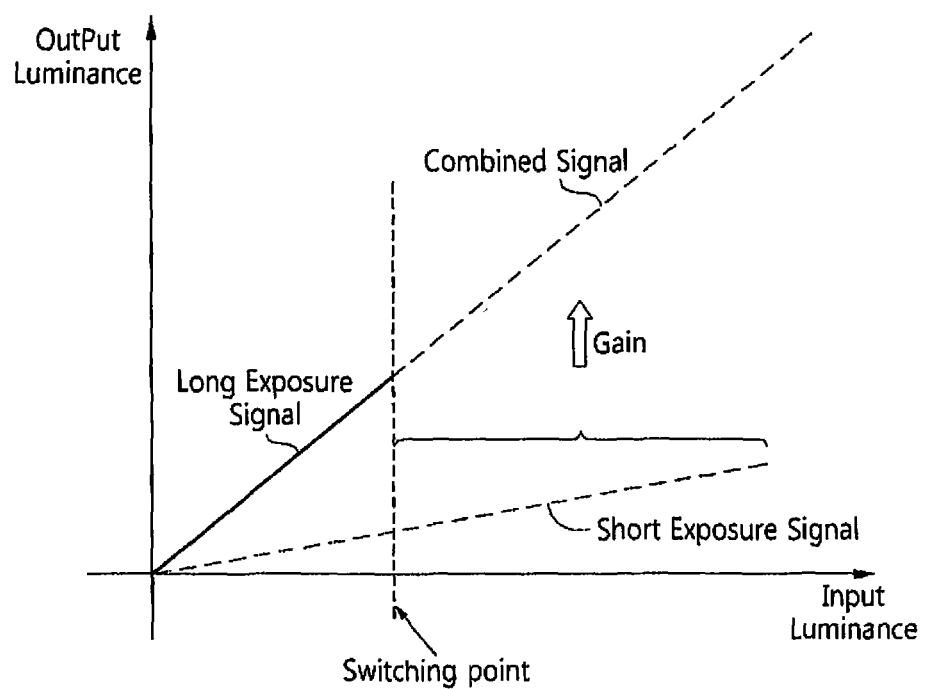
FIG. 16 shows input/output luminance characteristics of a long-exposure image signal and input/output luminance characteristics of a short-exposure image signal so as to describe a combining process of the long-exposure image signal and the short-exposure image signal.

FIG. 14 is a schematic block diagram of an image signal processor (ISP), FIGS. 15A 15B show exposure times and an amount of accumulated exposure light during one field in a CMOS image sensor shown in FIG. 13, and FIG. 16 shows input/output luminance characteristics of a long-exposure image signal and input/output luminance characteristics of a short-exposure image signal so as to describe a combining process of the long-exposure image signal and the short-exposure image signal.

Referring to FIG. 14, the ISP 610 of FIG. 13 may include a reconstruction circuit 200 and a dynamic range compression circuit 220.

A method of operating the reconstruction circuit 200 will be described referring to FIGS. 15 and 16.

First of all, referring to FIG. 15A, a T2 second long-exposure and T3 second short-exposure formed in accordance with a field period of T1 seconds (e.g., 1/60 seconds) are performed. According to an example embodiment, the long-exposure time and the short-exposure time may be varied.

In order to perform a long exposure and a short exposure, the long-exposure image signal and the short-exposure image signal are acquired depending on the number of rows in one field period. In order to combine the long-exposure image signal and the short-exposure image signal, captured image data are generated depending on the number of rows in one field.

A combination of the long-exposure image signal and the short-exposure image signal may be performed by the reconstruction circuit 200 of FIG. 14. A combining process by the reconstruction circuit 200 will be described referring to FIG. 16.

According to an example embodiment, input image data INPUT may include long-exposure image signals corresponding to the first image data, and short-exposure image signals corresponding to the second image data.

In the combining process by the reconstruction circuit 200, a combined signal or combined image may be generated by switching signals or images at a switching point indicated by a luminance threshold expressed by a dotted line. Here, the switching point means the point of time when the long-exposure image signal is saturated.

For example, a corresponding long-exposure image signal is applied to a pixel signal having a lower luminance level than a luminance level of the switching point, and a corresponding short-exposure image signal is applied to a pixel signal having a higher luminance level than the luminance level of the switching point.

Level matching between two images is performed by multiplying the short-exposure image signal by an exposure ratio or gain. For example, the exposure ratio or gain may be determined according to a ratio between the long-exposure image signal and the short-exposure image signal.

When the exposure ratio between the long-exposure image signal and the short-exposure image signal is K:1, exposure of the short-exposure image signal is 1/K of exposure of the long-exposure image signal. A luminance level of the long-exposure image signal is K times larger than a luminance level of the short-exposure image signal. Accordingly, two levels may be matched by multiplying the short-exposure image signal by a gain K.

In this manner, the short-exposure image signal is multiplied K times. As a result, a combined image having characteristics of the long-exposure signal and characteristics of a combined signal is generated.

That is, the reconstruction circuit 200 combines the input image data INPUT as described with reference to FIG. 16, and outputs a combined image OUTPUT1. The reconstruction circuit 200 may perform a function of linearly combining the short-exposure image signal (that is, a short exposure image) acquired through short exposure and the long-exposure image signal (that is, a long exposure image) acquired through long exposure.

The reconstruction circuit 200 multiplies the short exposure image by the exposure ratio, and then generates a linear image OUTPUT1 by linearly combining an image generated as a result of the multiplication and the long exposure image. For example, when the first image data corresponding to the long-exposure image signals are M-bits (for example, 14-bits), and the second image data corresponding to the short-exposure image signals are M-bits (for example, 14-bits), the first image data and the second image data are overlapped with each other in a certain section, and an overlapped combined image OUTPUT1 becomes smaller than 2*M bits. For example, the overlapped combined image OUTPUT1 may be 14-bits. Here, each bit number means a bit number of image data corresponding to each pixel signal output from each pixel.

The dynamic range compression circuit 220 lowers the bit number (e.g., 14-bits) of the overlapped combined image OUTPUT1 to a bit (e.g., 10-bits) for a display or an output standard, and outputs an image OUTPUT2 with a lowered bit number. For example, the dynamic range compression circuit 220 reduces the bit number of the combined image OUTPUT1 using a curve such as the well-known gamma connection (e.g., embodied in a local method or a global method), and outputs an output image OUTPUT2 with a reduced bit. For example, the dynamic range compression circuit 220 may perform a function of compressing a dynamic range of the combined image OUTPUT1.

FIG. 15B describes a rolling shutter method, and long exposure and short exposure may be overlapped with each other to proceed in FIG. 15B. T2 and T3 may be dependent on the number of rows.

Figure 17:
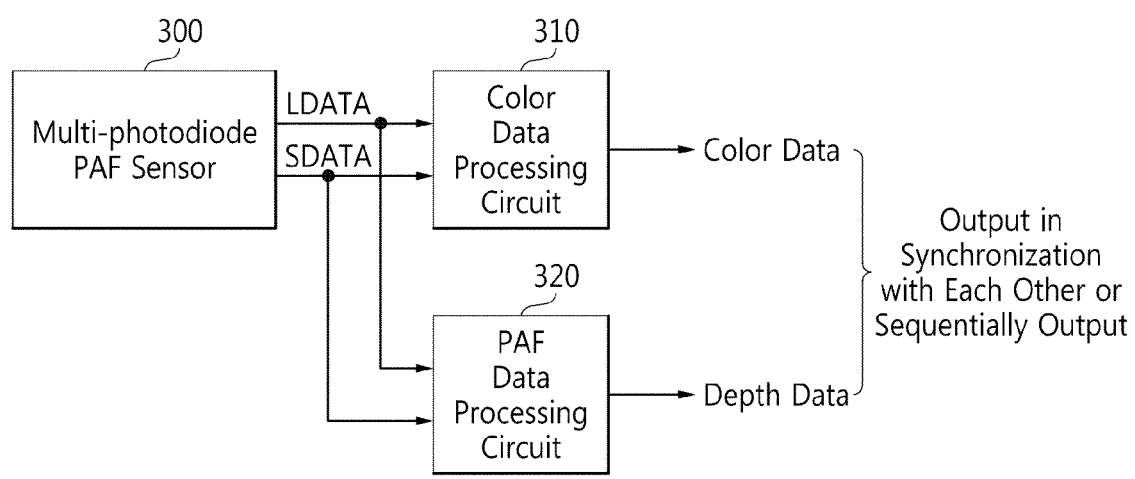
FIG. 17 is a block diagram which describes a method of outputting color data and depth data in a synchronization with each other from output signals of a multi-diode PAF sensor.

FIG. 17 is a block diagram which describes a method of outputting color data and depth data in synchronization with each other from output signals of a multi-diode PAF sensor. A circuit shown in FIG. 17 may be included as a portion of the CMOS image sensor 505 of FIG. 13.

An output signal of the multi-diode PAF sensor 300 may be a phase difference signal, that is, a signal output from a plurality of photoelectric conversion elements (e.g., photodiodes) included in a pixel.

A color data processing circuit 310 may perform processing for improving image data using signals LDATA and SDATA output from L and S photoelectric conversion elements, respectively. The processing may include pre-processing. The pre-processing may correct a problem occurring in a manufacture process of a CMOS image sensor before image processing is performed on a main color, e.g., RGB data. The correction may include lens shading correction and/or bad pixel correction, and the like.

The processing may include main color image processing. The main color image processing may include interpolation, noise reduction, edge enhancement, color correction, and/or gamma processing.

The color data processing circuit 310 may perform at least one of the pre-processing and the main color image processing.

The PAF data processing circuit 320 performs processing for improving depth data on a PAF pixel basis. The PAF data processing circuit 320 may be phase difference auto-focus data processing, and may perform a function of converting disparity data or depth data using the signals LDATA and SDATA output from photodiodes included in each pixel. For example, the disparity data may be data for an image at one point acquired through multi-diodes. The PAF data processing circuit 320 may perform a series of processing, e.g., noise reduction, so as to obtain the disparity data or the depth data. Each of the circuits 310 and 320 may be embodied in a pipeline structure.

Color data processed by the color data processing circuit 310 and depth data processed by the PAF data processing circuit 320 may be output in synchronization with each other or sequentially in a row according to example embodiments. According to an example embodiment, when the color data and the depth data are synchronized with each other, the color data and the depth data may be output in synchronization with each other. According to another example embodiment, the depth data may be output after the color data are output, or the color data may be output after the depth data are output. According to still another example embodiment, the color data and the depth data may be alternately output. According to still another example embodiment, a method of mixing and outputting the color data and the depth data may be used.

According to some example embodiments, when the multi-diode PAF sensor 300 is embodied in a first chip, the color data processing circuit 310 and the PAF data processing circuit 320 may be embodied in a second chip. For example, the color data processing circuit 310 and the PAF data processing circuit 320 may be embodied in an ISP, an application processor, or a system on chip (SoC). A circuit shown in FIG. 17 may output depth map data using full PAF pixels.

Figure 18:
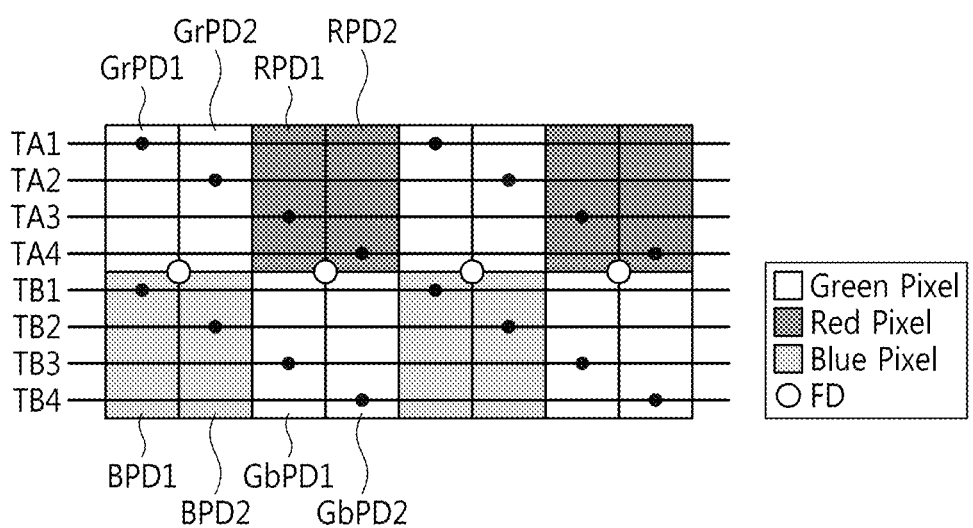
FIG. 18 is a conceptual diagram of transfer gate control lines for each row to control an operation of pixels according to an example embodiment of the present inventive concepts.
Figure 19:
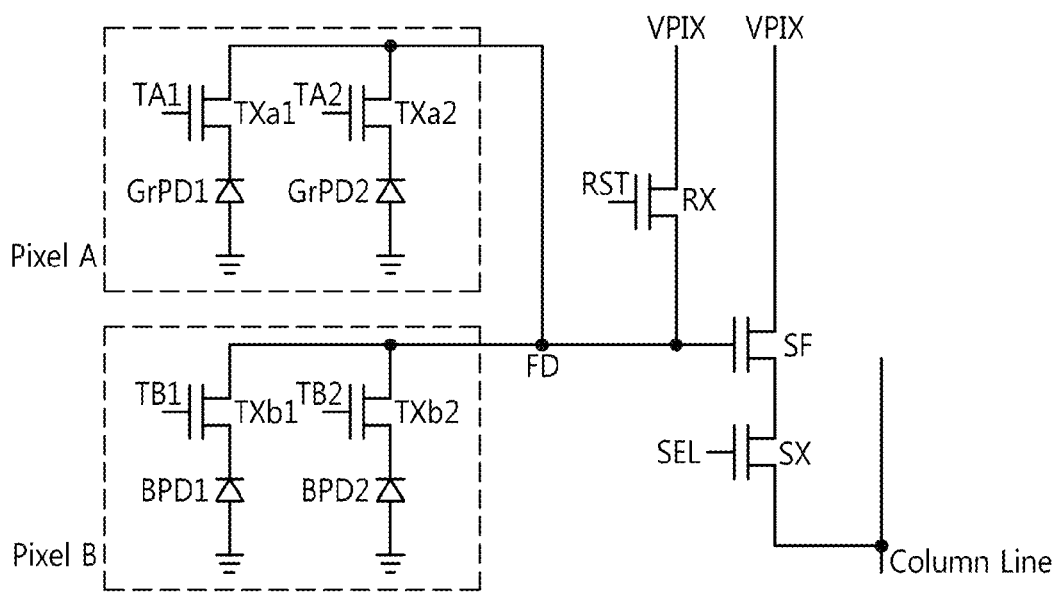
FIG. 19 is a circuit diagram of pixels disposed in the same column.

FIG. 18 is a conceptual diagram of transfer gate control lines for each row to control an operation of pixels according to an example embodiment of the present inventive concepts, and FIG. 19 is a circuit diagram of pixels disposed in the same column.

Referring to FIGS. 1, 7, 18, and 19, each of the pixels R, G, and B may include two photoelectric conversion elements. For example, a first green pixel may include two photoelectric conversion elements GrPD1 and GrPD2, a red pixel may include two photoelectric conversion elements RPD1 and RPD2, a blue pixel may include two photoelectric conversion elements BPD1 and BPD2, and a second green pixel may include two photoelectric conversion elements GbPD1 and GbPD2.

Each of the pixels R, G, and B described in the present specification means a PAF pixel which can perform a phase detection auto-focus operation or a phase difference auto-focus operation. As shown in FIG. 18, four transfer gate control lines may be disposed in each row.

A first control signal TA1 may control a transfer gate TXa1 connected to the photoelectric conversion element GrPD1, a second control signal TA2 may control a transfer gate TXa2 connected to the photoelectric conversion element GrPD2, a third control signal TA3 may control a transfer gate connected to the photoelectric conversion element RPD1, a fourth control signal TA4 may control a transfer gate connected to the photoelectric conversion element RPD2. The control signals TA1 to TA4 output from the exposure time control circuit, e.g., the row driver 520 of FIG. 13, may independently control exposure time of each of two photoelectric conversion elements included in each of the pixels disposed in a first row.

A fifth control signal TB1 may control a transfer gate TXb1 connected to the photoelectric conversion element BPD1, a sixth control signal TB2 may control a transfer gate TXb2 connected to the photoelectric conversion element BPD2, a seventh control signal TB3 may control a transfer gate connected to the photoelectric conversion element GrPD1, and an eighth control signal TB4 may control a transfer gate connected to the photoelectric conversion element GrPD2. The control signals TB1 to TB4 output from the exposure time control circuit, e.g., the row driver 520 of FIG. 13, may independently control exposure time of each of two photoelectric conversion elements included in each of the pixels disposed in a second row.

Charge accumulation and charge transfer by each of a plurality of photoelectric conversion elements included in each pixel may be controlled according to a corresponding control signal supplied to a gate of a corresponding transfer transistor.

According to another example embodiment, the first control signal TA1 may be supplied to a transfer gate connected to the photoelectric conversion element GrPD2 and the second control signal TA2 may be supplied to a transfer gate connected to the photoelectric conversion element GrPD1. Moreover, the design of a pixel array can be modified so that the third control signal TA3 may be supplied to a transfer gate connected to the photoelectric conversion element RPD2 and the fourth control signal TA4 may be supplied to a transfer gate connected to the photoelectric conversion element RPD1. For example, this embodiment may apply to the second column of 2 pixels shown in FIG. 1B.

FIG. 19 illustrates 2 photodiode pixels as shown in FIG. 9 sharing a common floating diffusion region FD. In FIG. 19, VPIX is the operation voltage VDD shown in FIG. 9. As shown in FIG. 19, when it is assumed that a pixel A is a first green pixel disposed in a first row and a pixel B is a blue pixel disposed in a second row, the first green pixel and the blue pixel disposed in the same column may share a floating diffusion region or floating diffusion node FD. That is, four photoelectric conversion elements GrPD1, GrPD2, BPD1, and BPD2 may share a floating diffusion region FD through four transfer gates.

Figure 20:
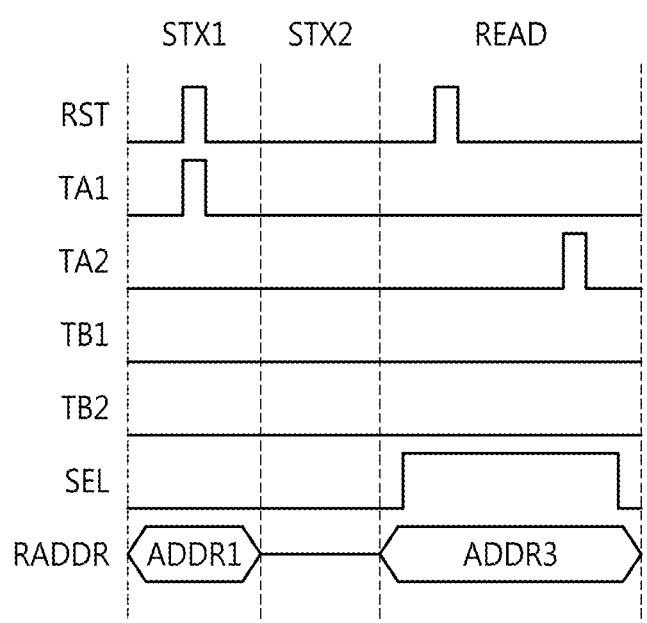
FIG. 20 is a timing diagram for describing an operation of the pixels shown in FIG. 19.

FIG. 20 is a timing diagram for describing an operation of the pixels shown in FIG. 19.

Referring to FIGS. 18 to 20, two shutter sections STX1 and STX2, and one readout section READ are present in one time period. The first photoelectric conversion element GrPD1 of the pixel A disposed in a first row corresponding to an address ADD1 is reset through the transfer gate TXa1 and a reset transistor RX. That is, the first control signal TA1 is supplied to a gate of the transfer transistor TXa1 and a reset signal RST is supplied to a gate of the reset transistor R in the first shutter section STX1. In the second shutter section STX2, a reset operation is not performed on a corresponding photoelectric conversion element.

In a readout section READ, a floating diffusion region FD of a pixel disposed in a row corresponding to an address ADD3 different from the address ADD1 is reset. Then, the second control signal TA2 is supplied to a gate of the transfer transistor TXa2 connected to the second photoelectric conversion element GrPD2 of the pixel A disposed in a first row. Accordingly, charges accumulated in the second photoelectric conversion element GrPD2 are transferred to a floating diffusion region FD through the transfer gate TXa2, a source follower SF operates in response to the charges transferred to the floating diffusion region FD, and a signal output from the source follower SF is transferred to a column line through a selection transistor SX.

Figure 21:
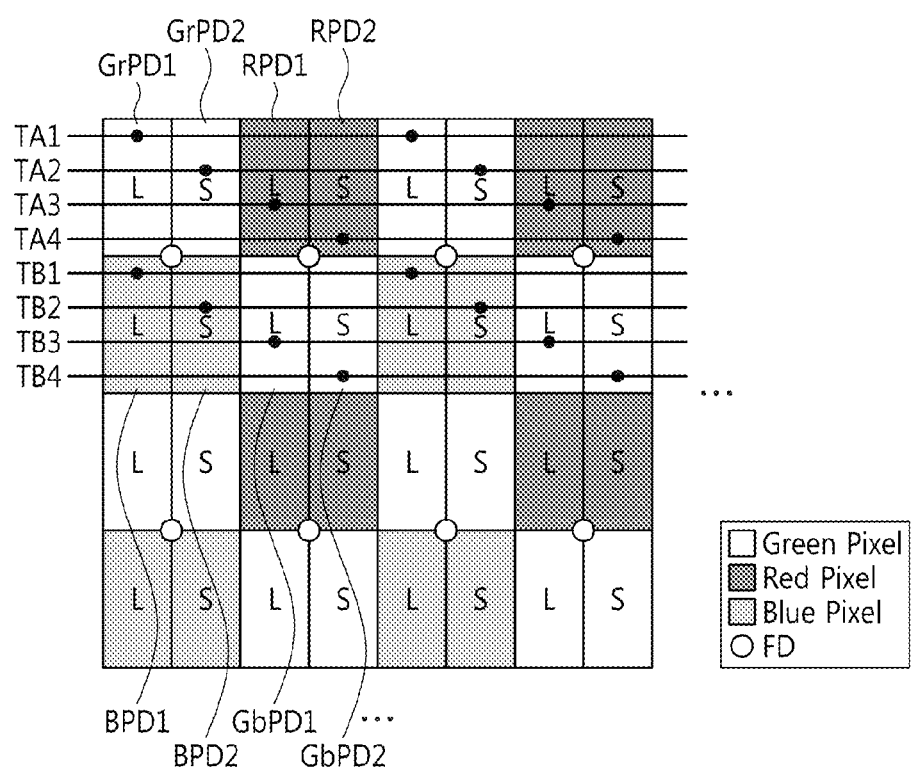
FIG. 21 is an example embodiment of an arrangement of pixels for a wide dynamic range (WDR)

FIG. 21 is an example embodiment of an arrangement of pixels for a wide dynamic range (WDR). Referring to FIGS. 18, 19, and 21, L means a photoelectric conversion element which can generate a long-exposure image signal, and S means a photoelectric conversion element which can generate a short-exposure image signal.

Each of the control signals TA1, TA3, TB1, and TB3 supplied to a gate of each transfer transistor connected to each of the photoelectric conversion elements GrPD1, RPD1, BPD1, and GbPD1 corresponds to a relatively long-exposure time. However, each of the control signals TA2, TA4, TB2, and TB4 supplied to a gate of each transfer transistor connected to each of the photoelectric conversion elements GrPD2, RPD2, BPD2, and GbPD2 corresponds to a relatively short-exposure time.

Figure 22:
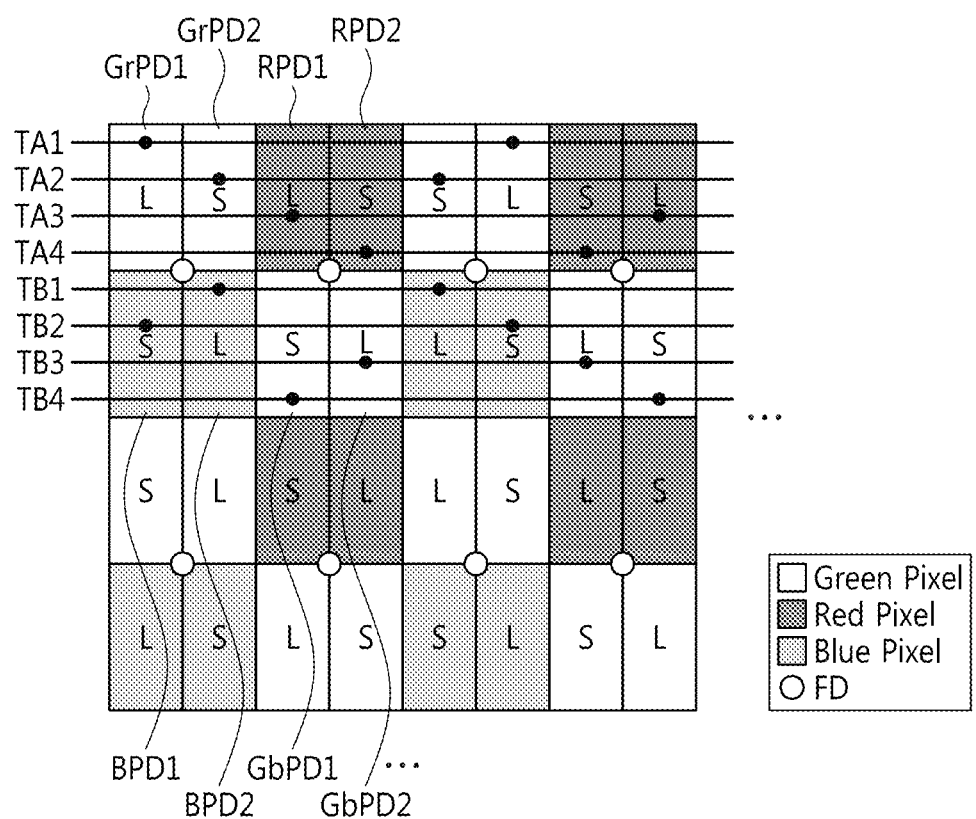
FIG. 22 is another example embodiment of the arrangement of pixels for a wide dynamic range (WDR)

FIG. 22 is another example embodiment of the arrangement of pixels for a wide dynamic range (WDR). Referring to FIGS. 18, 19, and 22, L means a photoelectric conversion element which can generate a long-exposure image signal, and S means a photoelectric conversion element which can generate a short-exposure image signal.

Each of the control signals TA1, TA3, TB1, and TB3 supplied to a gate of each transfer transistor connected to each of the photoelectric conversion elements GrPD1, RPD1, BPD2, and GbPD2 corresponds to a relatively long-exposure time. However, each of the control signals TA2, TA4, TB2, and TB4 supplied to a gate of each transfer transistor connected to each of the photoelectric conversion elements GrPD2, RPD2, BPD1, and GbPD1 corresponds to a relatively short-exposure time.

Since pixel signals corresponding to charges output from photoelectric conversion elements having the same exposure time are added, the row driver 520 controls each of the control signals TA1 to TA4, and TB1 to TB4 so as to perform a binning. Accordingly, the row driver 520 controls each of the control signals TA1 to TA4, and TB1 to TB4 related to exposure time according to an operation condition such as performance of PAF and/or binning.

As described referring to FIGS. 18 to 22, according to whether a control signal supplied to a gate of a transfer transistor connected to a photoelectric conversion element is a signal corresponding to a relatively long-exposure time or a signal corresponding to a relatively short-exposure time, pixels disposed in spatially different positions can be controlled to have different exposure times.

Here, L and S are relative to each other, and when a control signal corresponding to a relatively short-exposure time is supplied to a gate of a transfer transistor connected to S, the S may generate charges corresponding to a relatively short-exposure image signal. In addition, when a control signal corresponding to a relatively long-exposure time is supplied to a gate of a transfer transistor connected to L, the L, may generate charges corresponding to a relatively long-exposure image signal.

As described referring to FIGS. 18 to 22, since a control signal corresponding to a long-exposure time is supplied only to one of two photoelectric conversion elements included in each pixel, a Nyquest spatial frequency corresponding to pixel signals output from pixels described referring to FIGS. 18 to 22 is the same as a Nyquest spatial frequency corresponding to pixel signals output from pixels included in a general Bayer pattern, and a resolution of an image sensor including pixels described referring to FIGS. 18 to 22 may be the same as a resolution of an image sensor including the Bayer patterns.

Figure 23:
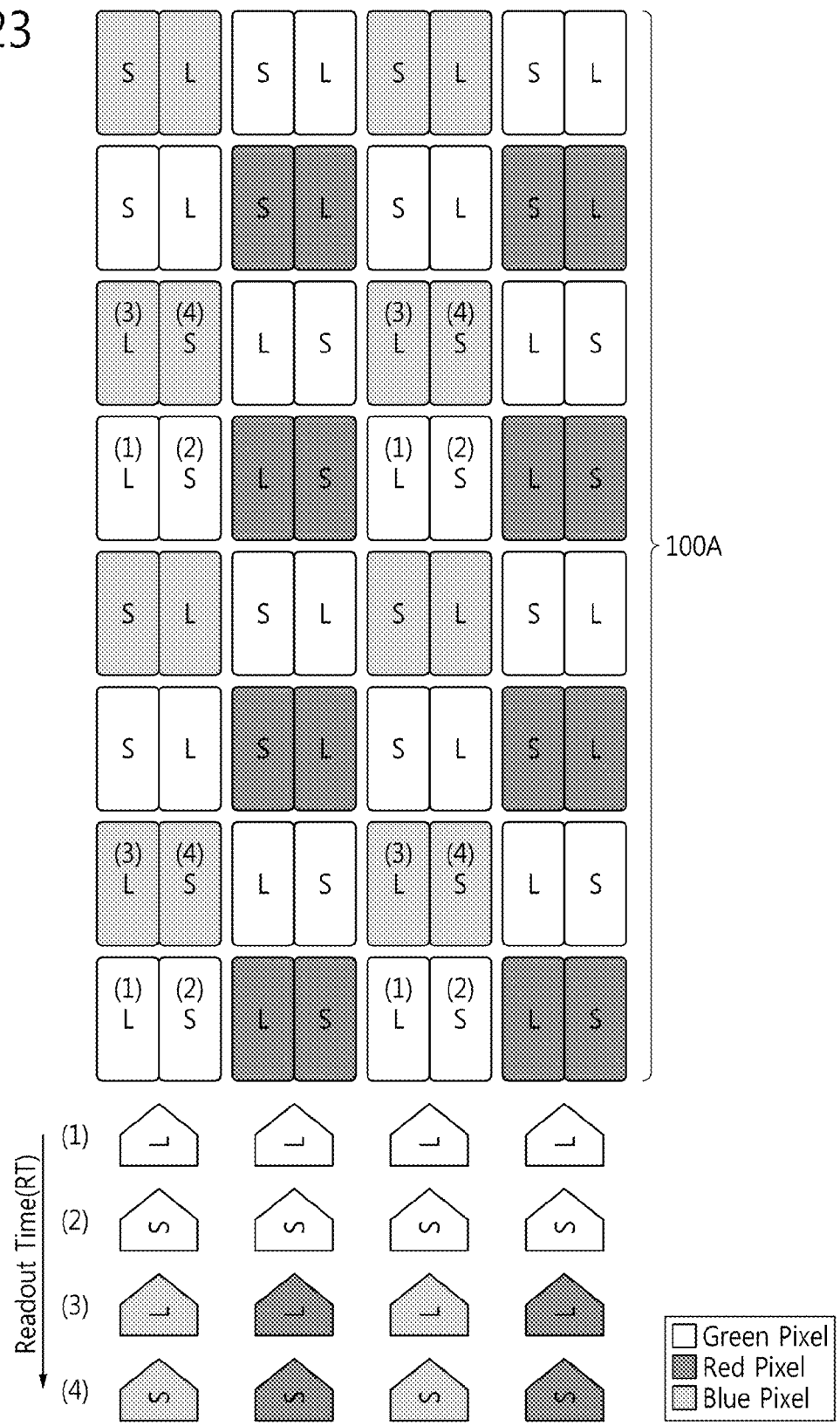
FIG. 23 is a conceptual diagram for describing a method of reading out pixel signals according to an example embodiment of the present inventive concepts.
Figure 24:
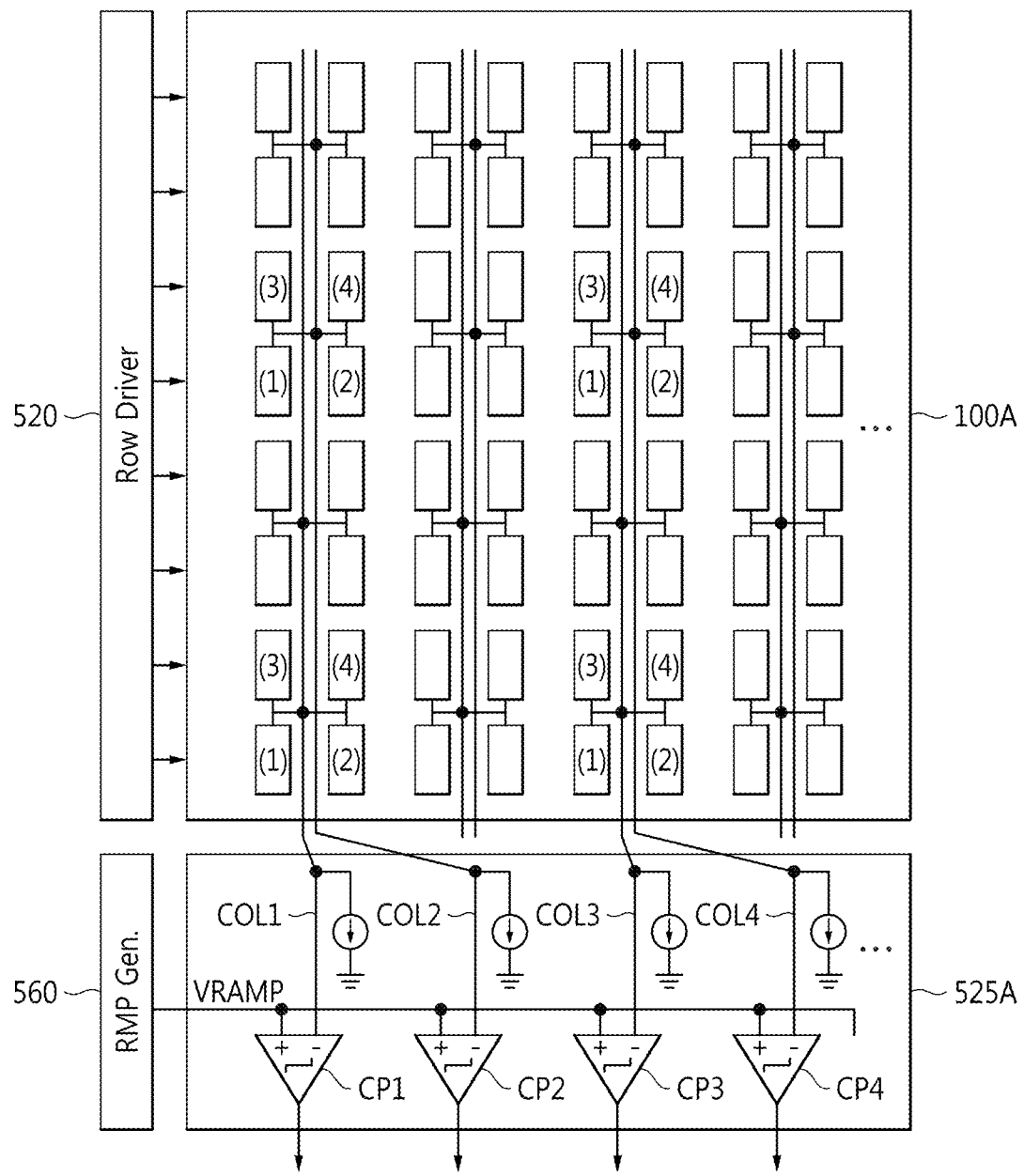
FIG. 24 is a circuit diagram for describing the method of reading out pixel signals shown in FIG. 23.

FIG. 23 is a conceptual diagram for describing a method of reading out pixel signals according to an example embodiment of the present inventive concepts, and FIG. 24 is a circuit diagram for describing the method of reading out pixel signals shown in FIG. 23. For convenience of description, it is assumed that image signals are output in an order from a time point (1) to a time point (4).

When control signals output from the row driver 520 are supplied to gates of transfer transistors connected to photoelectric conversion elements disposed in different positions at the time point (1), pixels including the photoelectric conversion elements may output pixel signals to comparators CP1 to CP4 in parallel through corresponding column lines COL1 to COL0.

Each of the comparators CP1 to CP4 embodied in a readout circuit 525A according to an example embodiment of the readout circuit 525 of FIG. 13 may compare a ramp signal VRAMP with each of pixel signals, and output each of comparison signals. The ramp signal VRAMP may be output from a reference signal generator, e.g., a ramp signal generator 560.

For example, long-exposure green image signals may be output from green pixels at the same time or in parallel at the time point (1). Short-exposure green image signals may be output from green pixels at the same time or in parallel at the time point (2). Long-exposure red image signals from red pixels and long-exposure blue image signals from blue pixels may be output the same time or in parallel at the time point (3). Short-exposure red image signals from red pixels and short-exposure blue image signals from blue pixels may be output at the same time or in parallel at the time point (4).

Figure 25:
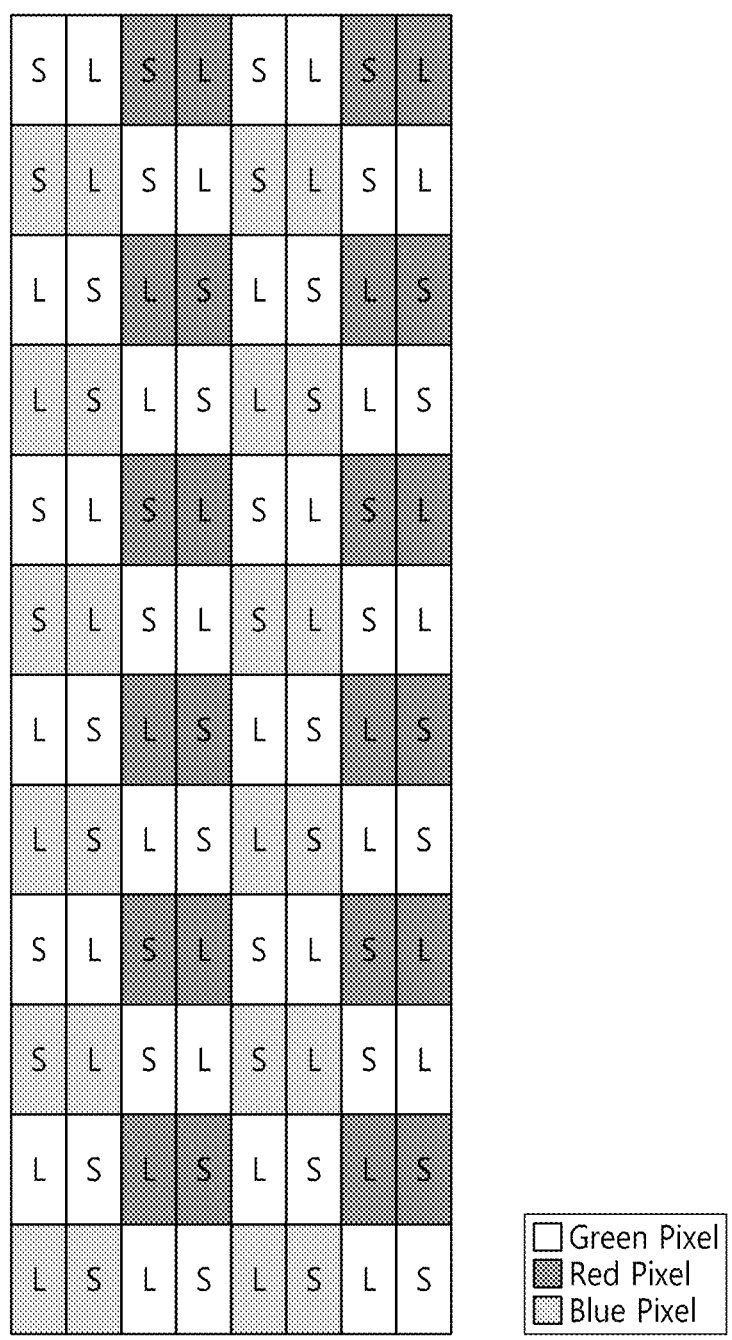
FIG. 25 is a conceptual diagram for describing an operation of a timing generator operating in a general operation condition.
Figure 26:
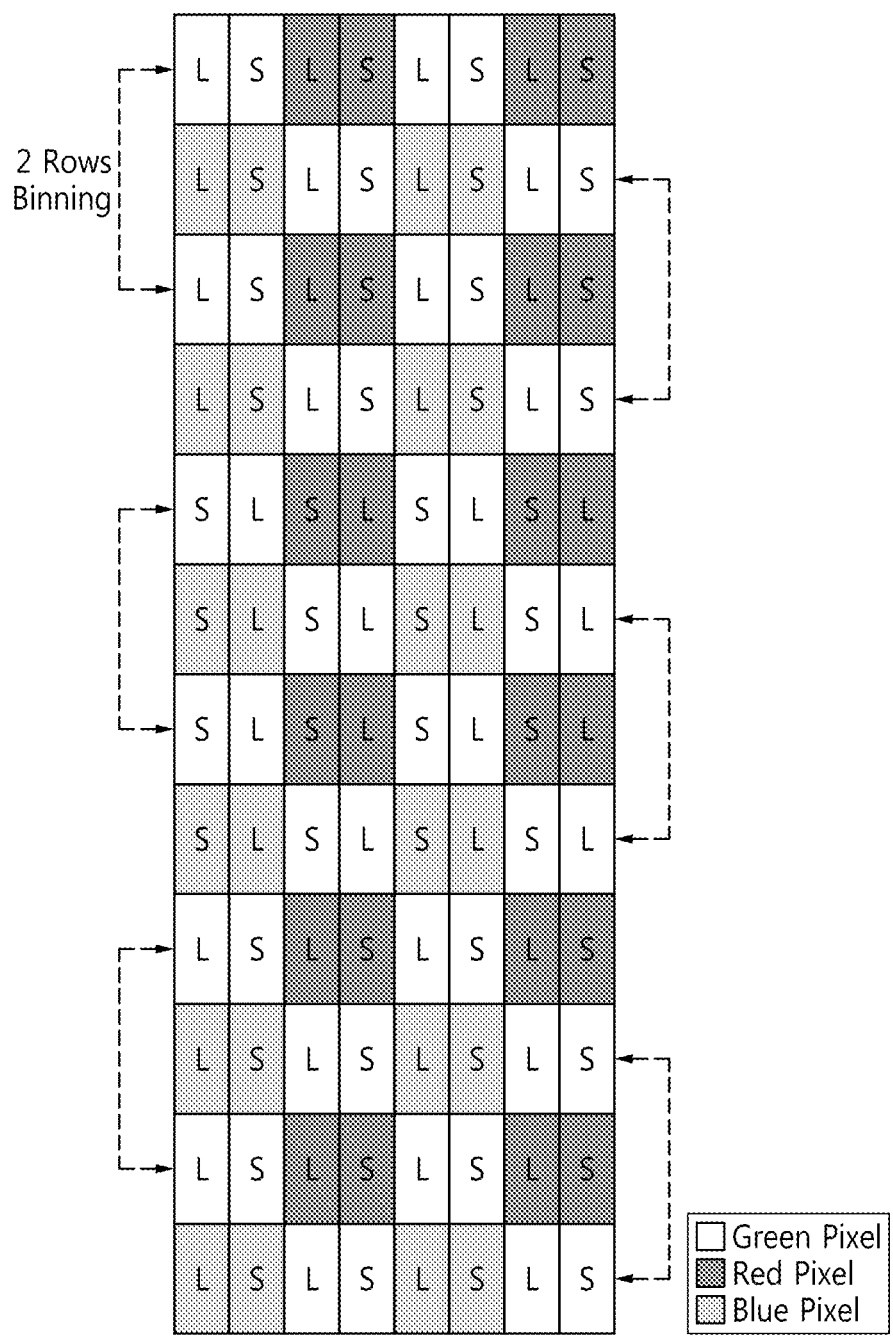
FIG. 26 is a conceptual diagram for describing an operation of the timing generator when binning in a two row basis.
Figure 27:
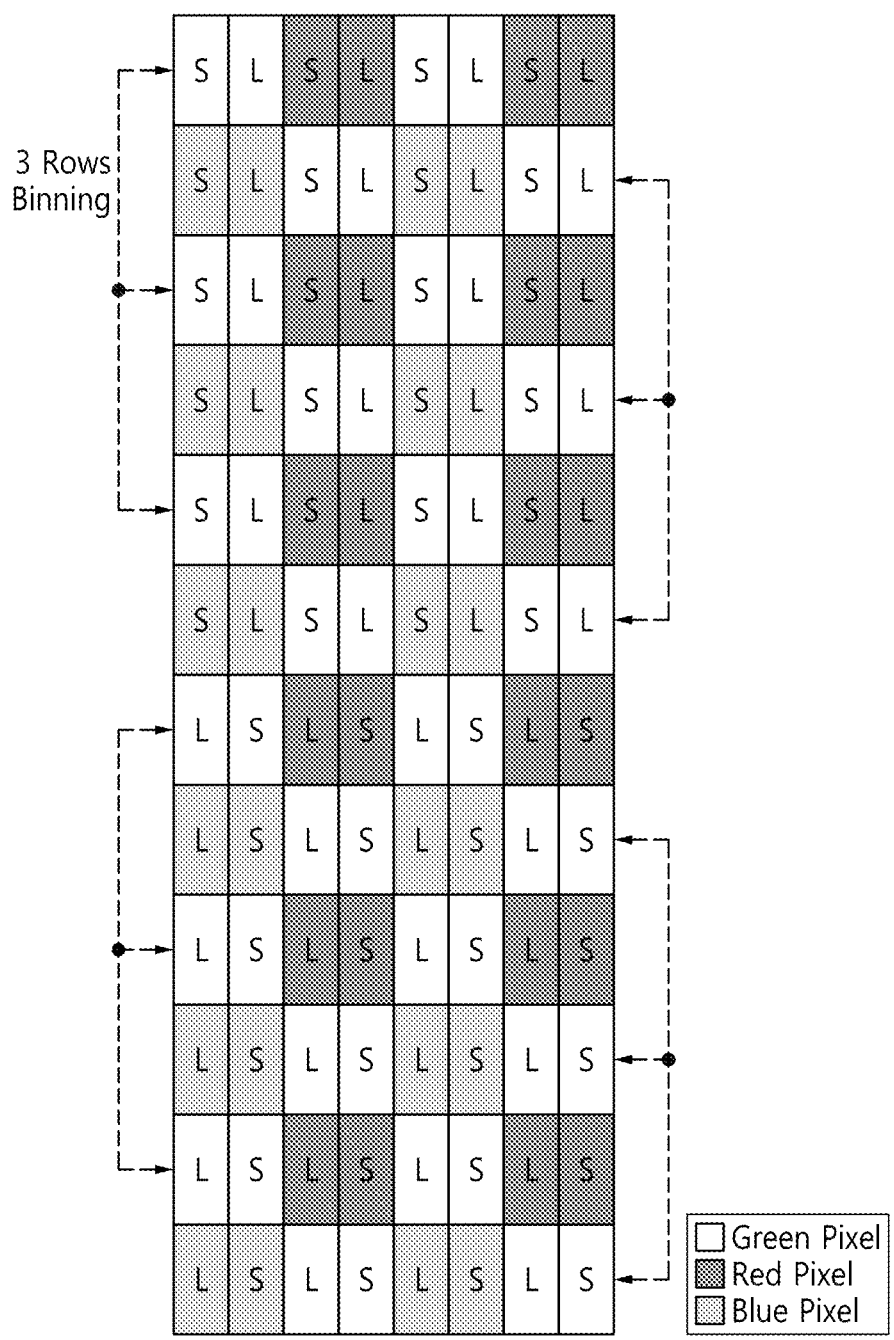
FIG. 27 is a conceptual diagram for describing an operation of the timing generator when binning in a three row basis.

FIG. 25 is a conceptual diagram for describing an operation of a timing generator operating in a general operation condition, FIG. 26 is a conceptual diagram for describing an operation of the timing generator when binning in a two row basis, and FIG. 27 is a conceptual diagram for describing an operation of the timing generator when binning in a three row basis.

Referring to FIGS. 13, and 18 to 27, a timing generator 530 may control the row driver 520 so that a phase difference detection performance may not be deteriorated under a WDR operation condition and a control signal corresponding to a long-exposure time may be supplied to one of two photoelectric conversion elements included in each pixel. The timing generator 530 may control exposure of each of the pixels in a binning condition to be described referring to FIGS. 27, 28, and 29.

Figure 28:
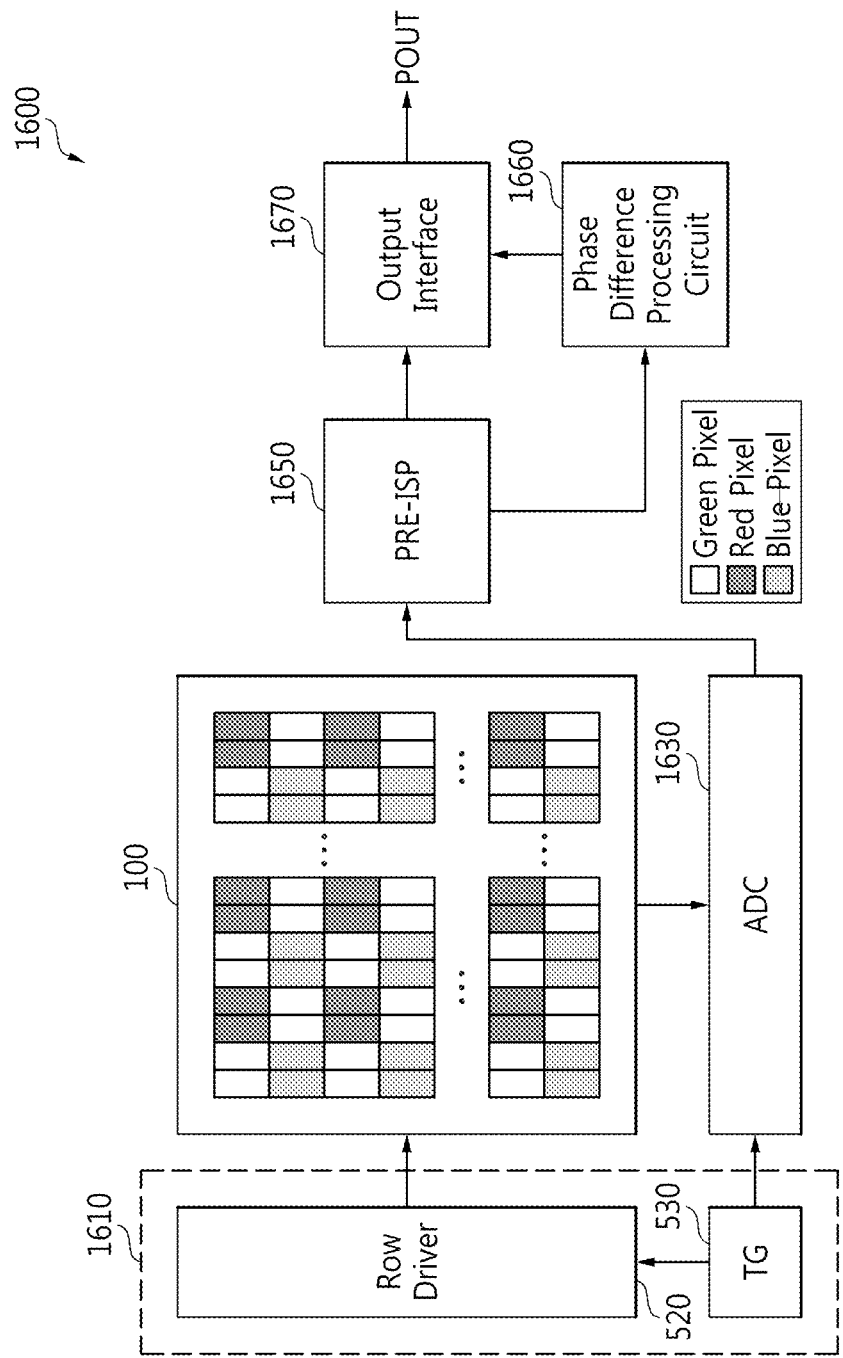
FIG. 28 is a block diagram which shows another example embodiment of a data processing system including the pixels shown in FIG. 1 or 18.
Figure 29:
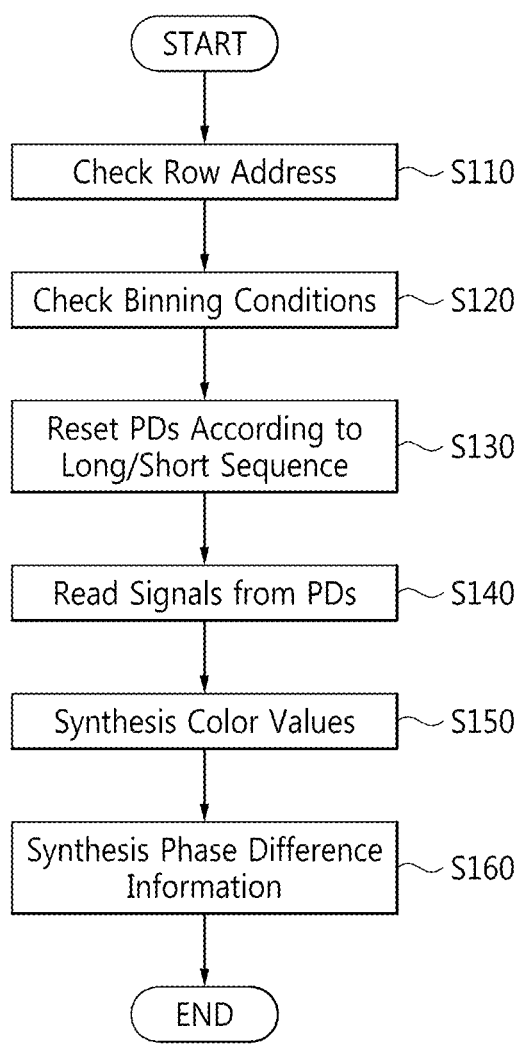
FIG. 29 is a flowchart for describing an operation of the data processing system shown in FIG. 28.

FIG. 27 is a WDR pattern corresponding to an exposure control for a general operation condition. FIG. 28 is a WDR pattern corresponding to an exposure control when binning two rows. In this case, each of the two rows are read at the same time. FIG. 29 is a WDR pattern corresponding to an exposure control when binning three rows. In this case, each of the three rows are read at the same time.

FIG. 28 is a block diagram which shows another example embodiment of a data processing system including the pixels shown in FIG. 1 or 18. A data processing system 1600 includes a pixel array 100, a control circuit (or an exposure time control circuit) 1610, an analog-digital converter 1630, a pre-ISP 1650, a phase difference processing circuit 1660, and an output interface 1670.

The pixel array 100 includes a plurality of pixels. Each of the plurality of pixels may be a pixel described referring to FIGS. 1 to 27. That is, each pixel may include two or more photoelectric conversion elements which can be independently controlled.

The exposure time control circuit 1610 may independently control exposure time of each of photoelectric conversion elements for each pixel. The exposure time control circuit 1610 may include the row driver 520 and the timing generator 530.

FIG. 29 is a flowchart for describing an operation of the data processing system shown in FIG. 28. Referring to FIGS. 28 and 29, the timing generator 530 may check a current row address, generate first exposure time control signals based on a result of the check, and output the generated first exposure time control signals to the row driver 520 (S110) according to an example embodiments. That is, the first exposure time control signals may be generated based on only a current row address.

The row driver 520 generates control signals corresponding to a long-sequence and/or a short-sequence in response to the first exposure time control signals. The long-sequence means a sequence for controlling a long-exposure time, and the short-sequence means a sequence for controlling a short-exposure time.

According to another example embodiment, the timing generator 530 may check binning condition data corresponding to binning conditions, generate first exposure time control signals based on a result of the check, and output the generated first exposure time control signals to the row driver 520 (S120). In one embodiment, the timing generator 530 may store the binning condition data (e.g., set during manufacture or programmed by external command received by, for example, a control register block such as control register block 550 shown in FIG. 13). Alternatively, the timing generator 530 may access the binning condition data stored in another element such as a control register block. That is, the first exposure time control signals may be generated based on the binning condition data only. Here, the binning condition data may be data corresponding to the number of rows to be used in a binning operation as described referring to FIGS. 25, 26, and 27.

According to still another example embodiment, the timing generator 530 may generate first exposure time control signals and output generated first exposure time control signals to the row driver 520 based on a result of the check S110 for a current row address and a result of the check S120 for binning condition data. Photoelectric conversion elements, e.g., photodiodes, embodied in each pixel are reset according to a long-sequence and/or a short-sequence (S130).

Photoelectric conversion elements embodied in each pixel transfer charges integrated or accumulated according to the long-sequence and/or the short-sequence to a corresponding floating diffusion region through transfer transistor. That is, pixels output pixel signals to the analog-digital converter 1630 through column lines after the respective exposure time elapses (S140).

The analog-digital converter 1630 converts pixel signals output from pixels into digital signals, and transfers the digital signals to the pre-ISP 1650. The pre-ISP 1650 may perform a lens shading correction and/or a bad pixel correction on digital signals, generate color information according to a result of the performing, and output generated color information to the output interface 1670. Moreover, the pre-ISP 1650 may output digital signals or signals corresponding to a result of the performing to the phase difference processing circuit 1660.

The phase difference processing circuit 1660 may compress the digital signals transferred from the pre-ISP 1650 or signals corresponding to a result of the performing, and output phase difference information corresponding to a result of the compression to the output interface 1670. For example, the phase difference processing circuit 1660 may convert digital signals transferred from the pre-ISP 1650 into Y values (e.g., phase values), detect parity between the digital signals corresponding to long-exposure image signals and the digital signals corresponding to short-exposure image signals, and generate phase difference information corresponding to a result of the detection.

For example, the phase difference processing circuit 1660 may calculate an average of digital signals corresponding to pixel signals output from pixels included in M rows, where M is a natural number equal to or more than 2 in a Y-axis direction, and generate phase difference information compressed to 1/M.

The output interface 1670 may output color information output from the pre-ISP 650 and phase difference information output from the phase difference processing circuit 1660. The output interface 1670 may determine an output sequence of the color information and the phase difference information.

Figure 30:
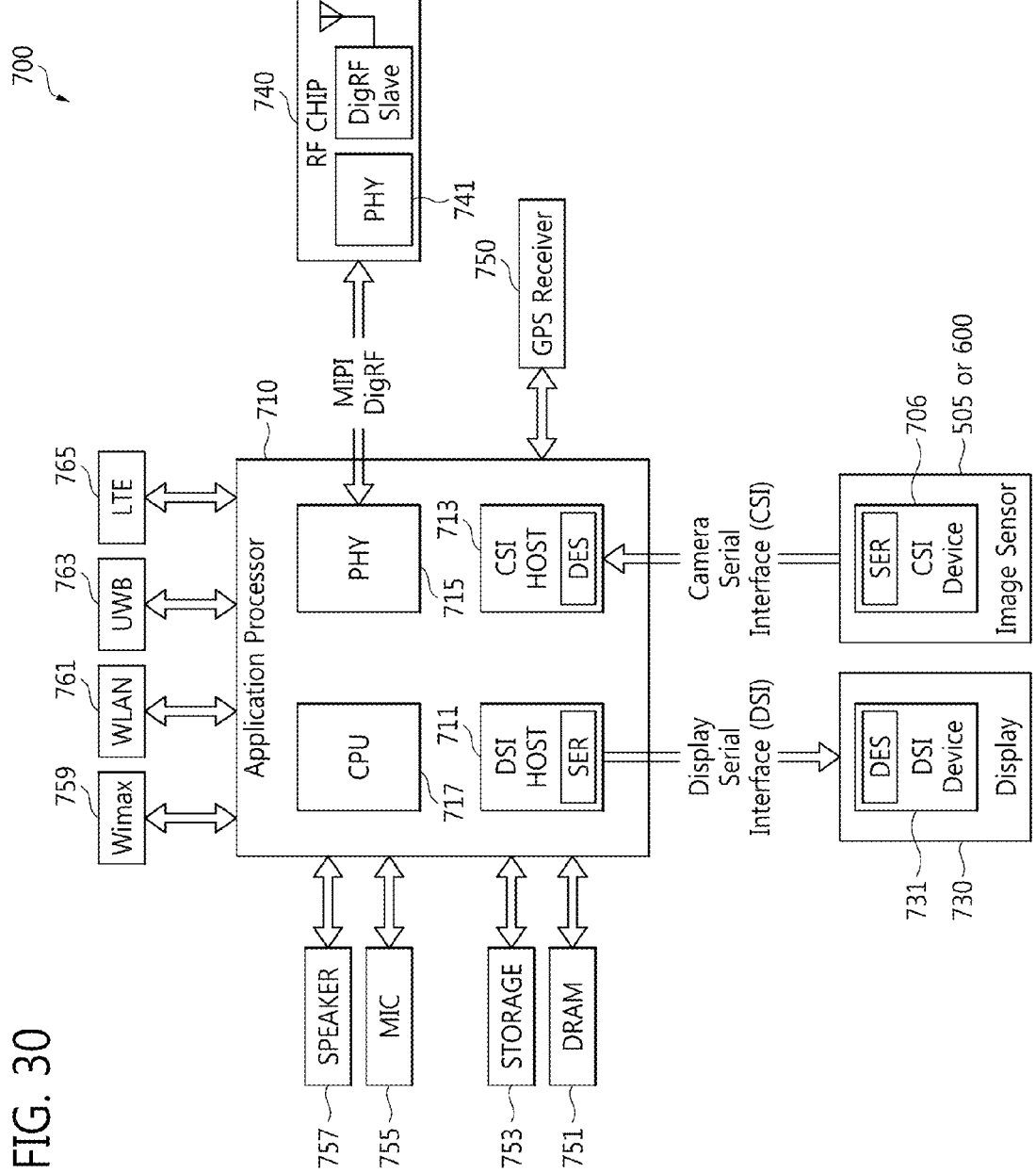
FIG. 30 is a block diagram which shows another example embodiment of the data processing system including the pixels shown in FIG. 1 or 18.

FIG. 30 is a block diagram which shows another example embodiment of the data processing system including the pixels shown in FIG. 1 or 18. Referring to FIGS. 1 to 30, a data processing system 700 may be embodied in a data processing system which can use or support a mobile industry processor interface (MIPI). The data processing system 700 may be embodied in a portable electronic device. The portable electronic device may be a mobile computing device. The mobile computing device may be a laptop computer, a mobile phone, a smart phone, a tablet PC, a digital camera, a camcorder, an MID, a wearable computer, an IoT device, or an IoE device.

The data processing system 700 may include an application processor (AP) 710, an image sensor 505, and a display 730.

A camera serial interface (CSI) host 713 embodied in the AP 710 may perform a serial communication with a CSI device 706 of the image sensor 505 through a CSI. According to an example embodiment, the CSI host 713 may include a de-serializer DES, and the CSI device 706 may include a serializer SER.

The image sensor 505 may include a plurality of pixels or a plurality of active pixel sensor as described referring to FIGS. 1 to 13, and 15 to 28. Each of the plurality of pixels may include a plurality of photoelectric conversion elements which can be independently controlled. Each structure of the plurality of pixels is as described referring to FIG. 7 or 8. The image sensor 505 may be embodied in a front side illuminated (FSI) CMOS image sensor or a back side illuminated (BSI) CMOS image sensor.

In addition, the image sensor 505 may include a control circuit (or an exposure time control circuit), e.g., the row driver, which can independently control exposure time of each of a plurality of photoelectric conversion elements included in each pixel according to a row address and/or binning condition data.

A display serial interface (DSI) host 711 embodied in the AP 710 may perform a serial communication with a DSI device 731 of the display 730 through a DSI. According to an example embodiment, the DSI host 711 may include the serializer SER and the DSI device 731 may include the de-serializer DES. For example, image data output from the image sensor 505 may be transferred to the AP 710 through a CSI. The AP 710 may process the image data, and transfer processed image data to the display 730 through a DSI.

The data processing system 700 may further include a RF chip 740 which communicates with the AP 710. A physical layer (PHY) 715 of the AP 700 and a physical layer (PHY) 741 of the RF chip 740 may transmit or receive data to or from each other according to MIPI DigRF.

The CPU 717 may control an operation of each of the DSI host 711, the CSI host 713, and the PHY 715, and include one or more cores.

The AP 710 may be embodied in an integrated circuit, and a system on chip (SoC), and may be a processor or a host which can control an operation of the image sensor 505.

The data processing system 700 may include a GPS receiver 750, a volatile memory 751 such as a dynamic random access memory (DRAM), a data storage device 753 including a non-volatile memory such as a flash-based memory, a mike 755, and/or a speaker 757. The data storage device 753 may be embodied in an external memory which is attachable or detachable to or from the AP 710. In addition, the data storage device 753 may be embodied in a universal flash storage (UFS), a multimedia card (MMC), an embedded MMC (eMMC™), or a memory card.

The data processing system 700 can communicate with an external device using at least one communication protocol, e.g., a worldwide interoperability for microwave access (WiMAX) 759, a Wireless Lan (WLAN) 761, a ultra-wideband (UWB) 763, and/or a long term evolution (LTE™) 765. According to an example embodiment, the data processing system 700 may further include a near-field communication (NFC) module, a Wi-Fi module, and/or a Bluetooth module.

An image sensor according to an example embodiment of the present inventive concepts may include a plurality of photoelectric conversion elements which are independently controlled in each pixel, and have their exposure times or integration times independently controlled. The image sensor including a pixel array can uniformly detect phase difference signals in an entire region of the pixel array using a plurality of photoelectric conversion elements included in each pixel disposed in the pixel array.

An image quality of generated color images can be improved by the image sensor capable of processing phase difference signals which are uniformly detected. Moreover, reliability of phase difference signals detected by the image sensor is increased and a spatial resolution of the image sensor is increased, such that an auto-focus performance of the image sensor is improved.

Although a few embodiments of the present general inventive concepts have been shown and described, it will be appreciated by those skilled in the art that changes may be made in these embodiments without departing from the principles and spirit of the general inventive concepts, the scope of which is defined in the appended claims and their equivalents.

What is claimed is:

1. An image sensor comprising:
a pixel array including pixels, the pixels arranged in a plurality of rows and a plurality of columns, each of the pixels including photoelectric conversion elements; and
a control circuit configured to independently control exposure times of each of the photoelectric conversion elements included in each of the pixels based on binning condition data, the binning condition data indicative of a number of the plurality of rows to be used in a binning operation for the image sensor;

wherein photoelectric conversion elements of pixels in a first of the plurality of rows are coupled to a first set of transfer lines, wherein photoelectric conversion elements of pixels in a second of the plurality of rows are coupled to a second set of transfer lines, wherein the first row is adjacent to the second row, and wherein the first set of transfer lines is separate from the second set of transfer lines.

2. The image sensor of claim 1, wherein the control circuit is further configured to independently control the exposure time of each of the photoelectric conversion elements included in each of the pixels in the first row using a row address of the first row.

3. The image sensor of claim 1, wherein
the pixels include
a first pixel, which includes a first photoelectric conversion element and a second photoelectric conversion element, and
a second pixel, which includes a third photoelectric conversion element and a fourth photoelectric conversion element; and
the control circuit is further configured to
output a first control signal for controlling a first exposure time of the first photoelectric conversion element through a first control line,
output a second control signal for controlling a second exposure time of the second photoelectric conversion element through a second control line,
output a third control signal for controlling a third exposure time of the third photoelectric conversion element through a third control line, and
output a fourth control signal for controlling a fourth exposure time of the fourth photoelectric conversion element through a fourth control line.

4. The image sensor of claim 3, wherein, the first pixel and the second pixel are in the first row or a first of the plurality of columns, the first exposure time and the third exposure time are equal, the second exposure time and the fourth exposure time are equal, and the first exposure time is longer than the second exposure time.

5. The image sensor of claim 3, wherein the first pixel and the second pixel are in a first of the plurality of columns, the first exposure time and the fourth exposure time are the same, the second exposure time and the third exposure time are the same, and the first exposure time is longer than the second exposure time.

6. The image sensor of claim 1, wherein
the first row includes
a first pixel having a first photoelectric conversion element and a second photoelectric conversion element, and
a second pixel having a third photoelectric conversion element and a fourth photoelectric conversion element;
the first photoelectric conversion element and the second photoelectric conversion element share a first floating diffusion region through corresponding transfer gates; and
the third photoelectric conversion element and the fourth photoelectric conversion element share a second floating diffusion region, which is different from the first floating diffusion region, through corresponding transfer gates.

7. The image sensor of claim 1, wherein
the pixels include
a first pixel in a first of the plurality of columns, the first pixel including a first photoelectric conversion element and a second photoelectric conversion element, and
a second pixel in the first of the plurality of columns, the second pixel including a third photoelectric conversion element and a fourth photoelectric conversion element; and
the first pixel and the second pixel share one floating diffusion region.

8. The image sensor of claim 1, wherein a first deep trench isolation (DTI) structure is formed between two corresponding pixels among the pixels, and a second DTI structure is formed between two corresponding photoelectric conversion elements among the photoelectric conversion elements included in each of the pixels.

9. The image sensor of claim 8, wherein each of the pixels comprise:
a color filter over the photoelectric conversion elements included in each pixel; and
a microlens over the color filter.

10. The image sensor of claim 1, wherein
each of the pixels include
a first photoelectric conversion element and a second photoelectric conversion element; and
the control circuit is further configured to
output a first control signal for controlling a first exposure time of the first photoelectric conversion element through a first control line, and
output a second control signal for controlling a second exposure time of the second photoelectric conversion element through a second control line.

11. A data processing system comprising:
an image sensor including
a pixel array including pixels arranged in a plurality of rows and columns, each of the pixels including photoelectric conversion elements, and
a control circuit configured to independently control exposure times of each of the photoelectric conversion elements included in each of the pixels based on binning condition data, the binning condition data indicative of a number of the plurality of rows to be used in a binning operation for the image sensor; and
a controller configured to control an operation of the image sensor, wherein
each of the pixels is independently controlled to detect a phase difference,
photoelectric conversion elements of pixels in a first of the plurality of rows are coupled to a first set of transfer lines,
photoelectric conversion elements of pixels in a second of the plurality of rows are coupled to a second set of transfer lines,
the first row is adjacent to the second row, and
the first set of transfer lines is separate from the second set of transfer lines.

12. The data processing system of claim 11, wherein the control circuit is further configured to independently control the exposure time of each of the photoelectric conversion elements included in each of the pixels in the first row using a row address of the first row.

13. The data processing system of claim 11, wherein
the photoelectric conversion elements included in each of the pixels include a first photoelectric conversion element and a second photoelectric conversion element, the first photoelectric conversion element is controlled to have a relatively long-exposure time, and the second photoelectric conversion element is controlled to have a relatively short-exposure time; and the first photoelectric conversion element included in a first pixel among the pixels and the first photoelectric conversion element included in a second pixel adjacent to the first pixel among the pixels are disposed in a diagonal direction.

14. The data processing system of claim 11, wherein the photoelectric conversion elements include a first photoelectric conversion element and a second photoelectric conversion element;

the control circuit is further configured to control the first photoelectric conversion element to have a relatively long-exposure time, and to control the second photoelectric conversion element to have a relatively short-exposure time; and the first photoelectric conversion element included in each of the pixels is configured to output respective pixel signals in parallel according to the control of the control circuit.

15. The data processing system of claim 11, wherein the image processing system further comprises:

an analog-digital converter configured to convert pixel signals output from the photoelectric conversion elements included in each of the pixels into digital signals;

a pre-image signal processor configured to generate color information from the digital signals; and a phase difference processing circuit configured to generate phase difference data corresponding to the phase difference from the digital signals, and to compress the generated phase difference data.

16. The data processing system of claim 11, wherein a first deep trench isolation (DTI) structure is formed between two corresponding pixels among the pixels, and a second DTI structure is formed between two corresponding photoelectric conversion elements among the photoelectric conversion elements included in each of the pixels.

17. The data processing system of claim 16, wherein each of the pixels comprises:

a color filter over the photoelectric conversion elements included in each pixel; and a microlens over the color filter.

* * * * *